(12) United States Patent
Koshihara

(10) Patent No.: US 11,069,882 B2
(45) Date of Patent: Jul. 20, 2021

(54) OPTICAL UNIT AND DISPLAY DEVICE

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 222 days.

(21) Appl. No.: 16/365,251

(22) Filed: Mar. 26, 2019

(65) Prior Publication Data

US 2019/0305255 A1 Oct. 3, 2019

(30) Foreign Application Priority Data

Mar. 27, 2018 (JP) .............................. JP2018-059467

(51) Int. Cl.
*G02B 5/20* (2006.01)
*H01L 51/52* (2006.01)
(Continued)

(52) U.S. Cl.
CPC ............ *H01L 51/5281* (2013.01); *G02B 5/22* (2013.01); *G02B 27/0172* (2013.01);
(Continued)

(58) Field of Classification Search
CPC ............... H01L 51/5281; H01L 25/105; H01L 27/3258; H01L 27/3276; H01L 51/5012; H01L 51/5234; H01L 2251/5315; H01L 2251/558; G09G 3/3233; G09G 2300/0842; G09G 2300/0861; G02B 27/142; G02B 5/22; G02B 27/0172; G02B 27/149;
(Continued)

(56) References Cited

U.S. PATENT DOCUMENTS 5,371,617 A 12/1994 Mitsutake et al.
5,844,637 A 12/1998 Katsumata
(Continued)

FOREIGN PATENT DOCUMENTS

JP H11-067448 A 3/1999
JP 2003-057746 A 2/2003
(Continued)

OTHER PUBLICATIONS

Jul. 30, 2019 extended European Search Report issued in European Patent Application No. 19164868.2.

*Primary Examiner* — William R Alexander
*Assistant Examiner* — Henry A Duong
(74) *Attorney, Agent, or Firm* — Oliff PLC

(57) ABSTRACT

Provided are an optical unit and a display device being able to inhibit unwanted light, which is generated when a dichroic mirror transmits part of color light to be reflected, from being emitted from an emission surface of a dichroic prism. In the optical unit, color filters (a first color filter, a second color filter, and a third color filter) are provided between a dichroic prism and a first panel, a second panel, and a third panel, the color filters selectively transmitting light of wavelengths incident on the dichroic prism from each of the panels. Further, an optical resonator, which has a resonance wavelength corresponding to a wavelength range of image light incident on the dichroic prism from each of the panels, is provided on the first panel, the second panel, and the third panel.

21 Claims, 21 Drawing Sheets

(51) Int. Cl.
*G02B 27/01* (2006.01)
*G02B 27/14* (2006.01)
*G03B 33/12* (2006.01)
*H01L 25/10* (2006.01)
*H01L 27/32* (2006.01)
*H01L 51/50* (2006.01)
*G09G 3/3233* (2016.01)
*G02B 5/22* (2006.01)
*G03B 35/00* (2021.01)

(52) U.S. Cl.
CPC ......... *G02B 27/142* (2013.01); *G02B 27/149* (2013.01); *G03B 33/12* (2013.01); *G03B 35/00* (2013.01); *G09G 3/3233* (2013.01); *H01L 25/105* (2013.01); *H01L 27/3258* (2013.01); *H01L 27/3276* (2013.01); *H01L 51/5012* (2013.01); *H01L 51/5234* (2013.01); *G02B 2027/0114* (2013.01); *G09G 2300/0842* (2013.01); *G09G 2300/0861* (2013.01); *H01L 2251/5315* (2013.01); *H01L 2251/558* (2013.01)

(58) Field of Classification Search
CPC ........ G02B 2027/0114; G02B 27/1006; G02B 27/126; G02B 27/01; G02B 27/0101; G02B 27/0103; G02B 27/0149; G02B 27/017; G02B 27/0176; G02B 27/0179; G02B 27/0189; G02B 2027/0105; G02B 2027/0107; G02B 2027/0109; G02B 2027/011; G02B 2027/0112; G02B 2027/0116; G02B 2027/0118; G02B 2027/012; G02B 2027/0121; G02B 2027/0123; G02B 2027/0125; G02B 2027/0127; G02B 2027/0129; G02B 2027/013; G02B 2027/0132; G02B 2027/0134; G02B 2027/0136; G02B 2027/0138; G02B 2027/014; G02B 2027/0141; G02B 2027/0143; G02B 2027/0145; G02B 2027/0147; G02B 2027/015; G02B 2027/0152; G02B 2027/0154; G02B 2027/0156; G02B 2027/0158; G02B 2027/0163; G02B 2027/0165; G02B 2027/0167; G02B 2027/0169; G02B 2027/0174; G02B 2027/0178; G02B 2027/0181; G02B 2027/0183; G02B 2027/0185; G02B 2027/0187; G02B 2027/019; G02B 2027/0192; G02B 2027/0194; G02B 2027/0196; G02B 2027/0198; G02B 27/10; G02B 2027/0159; G02B 2027/0161; G03B 35/00; G03B 33/12
USPC ......................................................... 359/630
See application file for complete search history.

(56) References Cited

U.S. PATENT DOCUMENTS

| | | |
|---|---|---|
| 6,259,423 B1 | 7/2001 | Tokito et al. |
| 6,882,379 B1 | 4/2005 | Yokoyama et al. |
| 8,441,018 B2 | 5/2013 | Lee et al. |
| 2004/0109140 A1* | 6/2004 | Kiser .................. G02B 27/1053 353/31 |
| 2004/0219309 A1 | 11/2004 | Fujita et al. |
| 2005/0146652 A1 | 7/2005 | Yokoyama et al. |
| 2018/0019432 A1 | 1/2018 | Kurasawa et al. |

FOREIGN PATENT DOCUMENTS

| | | |
|---|---|---|
| JP | 2004-004968 A | 1/2004 |
| JP | 2004-319095 A | 11/2004 |
| JP | 2007-199486 A | 8/2007 |
| JP | 2008-164859 A | 7/2008 |
| JP | 2018-010392 A | 1/2018 |

* cited by examiner

OPTICAL UNIT AND DISPLAY DEVICE

BACKGROUND

1. Technical Field

The invention relates to an optical unit using a panel provided with a light emitting element, and a display device.

2. Related Art

As an optical unit using a panel provided with a light emitting element, and a display device, a mode is conceivable in which three organic electroluminescent panels emitting light of each color are arranged facing three incident surfaces of a dichroic prism. With this optical unit and display device, while red image light emitted from a red color organic electroluminescent panel is reflected by a first dichroic mirror toward an emission surface, the first dichroic mirror transmits blue image light emitted from a blue color organic electroluminescent panel and green image light emitted from a green color organic electroluminescent panel. Further, while the blue image light emitted from the blue color organic electroluminescent panel is reflected by a second dichroic mirror toward an emission surface, the second dichroic mirror transmits the red image light emitted from the red color organic electroluminescent panel and the green image light emitted from the green color organic electroluminescent panel. Thus, synthesized light that is a synthesis of the images of the red light, the green light, and the blue light is emitted from the emission surfaces of the dichroic prism, and a color image can thus be displayed (refer to JP-A-11-67448).

In the dichroic prism, while part of the color light that should be reflected passes through the dichroic mirror, some of the color light that should pass through is reflected by the dichroic mirror, and this results in the occurrence of unwanted light. When this type of unwanted light is reflected again by the organic electroluminescent panel, is incident on the dichroic prism, and is emitted from the emission surface, this may cause problems of ghosting and a deterioration in contrast.

SUMMARY

In light of the foregoing, an object of the invention is to provide an optical unit and a display device capable of inhibiting unwanted light, which is generated as a result of a part of color light to be reflected passing through a dichroic mirror, for example, from being emitted from an emission surface of a dichroic prism.

In order to solve the above-described problem, an optical unit according to an aspect of the invention includes a dichroic prism which includes a first incident surface, a second incident surface facing the first incident surface, a third incident surface provided between the first incident surface and the second incident surface, an emission surface facing the third incident surface, a first dichroic mirror configured to reflect light incident from the first incident surface toward the emission surface and transmit light incident from the second incident surface and the third incident surface, and a second dichroic mirror configured to reflect light incident from the second incident surface toward the emission surface and transmit light incident from the first incident surface and the third incident surface. The optical unit also includes a first panel which is provided with a first light-emitting element in a first display region, image light emitted from the first display region being incident, as first image light of a first wavelength range, on one of the incident surfaces, among the first incident surface, the second incident surface, and the third incident surface, a second panel which is provided with a second light-emitting element in a second display region, image light emitted from the second display region being incident, as second image light of a second wavelength range, on another of the incident surfaces that is different to the one of the incident surfaces, among the first incident surface, the second incident surface, and the third incident surface, and a third panel which is provided with a third light-emitting element in a third display region, image light emitted from the third display region being incident, as third image light of a third wavelength range, on remaining one of the incident surfaces that is different to the one of the incident surfaces and the other of the incident surfaces, among the first incident surface, the second incident surface, and the third incident surface. A first color filter that selectively transmits light of the first wavelength range is provided between the first light-emitting element and the dichroic prism.

According to the aspect of the invention, the first color filter that selectively transmits image light of the wavelength range that is incident on the dichroic prism from the first panel is provided between the dichroic prism and the first light-emitting element. Thus, even when unwanted light is generated due to a part of light of a second wavelength range or a third wavelength range that should be reflected passing through the dichroic mirror, or due to a part of the light of the second wavelength range or the third wavelength range that should pass through being reflected by the dichroic mirror, the unwanted light is blocked by the first color filter. As a result, it is possible to suppress the unwanted light from being reflected by the first panel and being emitted from the emission surface of the dichroic prism.

According to the invention, an aspect can be adopted in which the first panel includes a first optical resonator having a resonance wavelength corresponding to the first wavelength range. According to this aspect, even when part of the unwanted light of the second wavelength range or the third wavelength range passes through the first color filter, the unwanted light can be attenuated by the first optical resonator. As a result, it is possible to suppress the unwanted light from being reflected by the panel and being emitted from the emission surface of the dichroic prism.

According to the invention, an aspect can be adopted in which the first color filter and the first panel are integrally provided.

According to the invention, an aspect can be adopted in which the first panel includes a cover substrate fixed on the dichroic prism side of the first light-emitting element, and the first color filter is provided on the cover substrate.

According to the invention, an aspect can be adopted in which the first panel includes a coloring layer that colors the light emitted from the first light-emitting element to be the light of the first wavelength range.

According to the invention, an aspect can be adopted in which the first color filter is provided as the coloring layer that colors the light emitted from the first light-emitting element to be the light of the first wavelength range.

According to the invention, an aspect can be adopted in which the first panel includes a cover substrate fixed by an adhesive layer, on the dichroic prism side of the first light-emitting element, and the first color filter is configured by the adhesive layer.

According to the invention, an aspect can be adopted in which the first panel includes a cover substrate fixed on the dichroic prism side of the first light-emitting element, and the first color filter is configured by the cover substrate.

According to the invention, an aspect can be adopted in which the first color filter is provided between the first panel and the dichroic prism.

According to the invention, an aspect can be adopted in which the optical unit includes an adhesive layer that fixes the first panel to the dichroic prism, and the first color filter is configured by the adhesive layer.

According to the invention, an aspect can be adopted in which the first color filter is laminated over the dichroic prism.

According to the invention, an aspect can be adopted in which a second color filter that selectively transmits light of the second wavelength range is provided between the second light-emitting element and the dichroic prism.

According to the invention, an aspect can be adopted in which the second panel is provided with a second optical resonator having a resonance wavelength corresponding to the second wavelength range.

According to the invention, an aspect can be adopted in which a third color filter that selectively transmits light of the third wavelength range is provided between the third light-emitting element and the dichroic prism.

According to the invention, an aspect can be adopted in which the third panel includes a third optical resonator having a resonance wavelength corresponding to the third wavelength range.

According to the invention, an aspect can be adopted in which the first color filter is light-absorbent.

According to the invention, an aspect can be adopted in which, the first color filter is provided in a region through which, among luminous fluxes of image light emitted toward the dichroic prism from the first display region, an effective luminous flux corresponding to a luminous flux emitted from the emission surface passes.

According to the invention, an aspect can be adopted in which the first color filter is provided in a region through which, among luminous fluxes of image light emitted toward the dichroic prism from the first display region, an effective luminous flux used in display of an image passes.

According to a display device provided with the optical unit to which the invention is applied, the display device displays an image using synthesized light of the first image light, the second image light, and the third image light emitted from the emission surface of the dichroic prism.

According to a display device according to the invention, an aspect can be adopted in which the display device includes a virtual display unit configured to display a virtual image using the synthesized light.

According to the display device according to the invention, an aspect can be adopted in which the display device includes a projection optical system configured to project the synthesized light.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
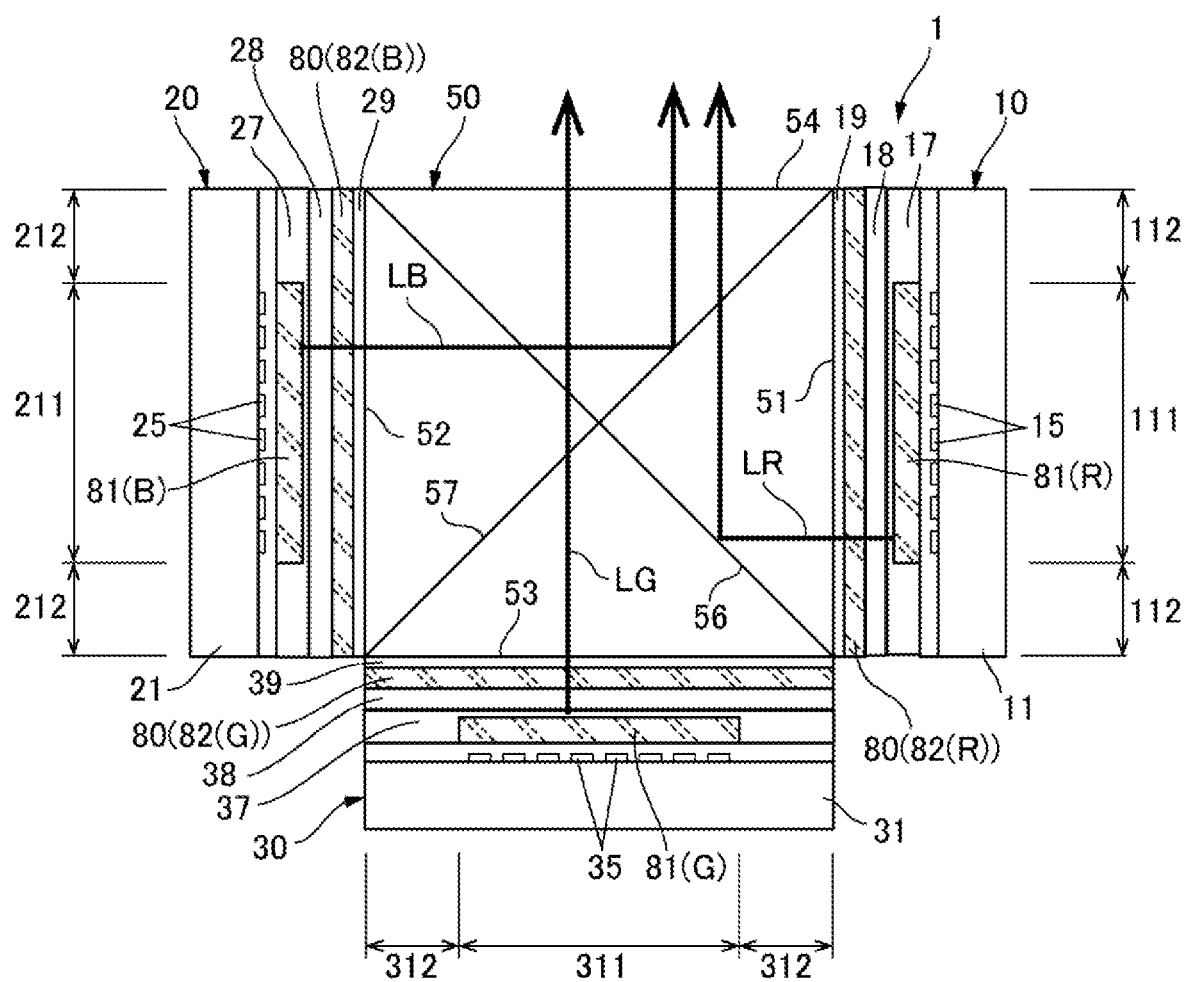
FIG. 1 is a plan view of an optical unit according to First Exemplary Embodiment of the invention.

Exemplary embodiments of the invention will be described. Note that in the drawings referred to in the description below, to illustrate each layer or each member at a recognizable size on the drawings, the number and scale of each layer or each member are differentiated.

First Exemplary Embodiment

Overall Configuration

Figure 2:
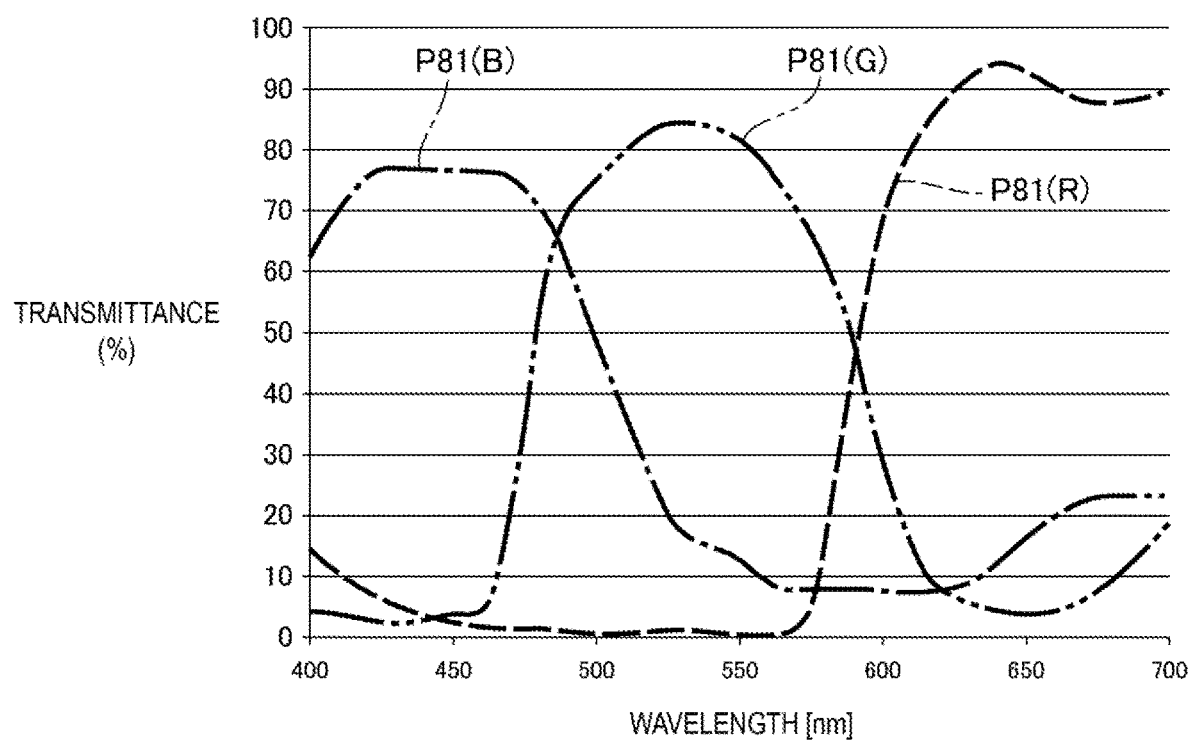
FIG. 2 is an explanatory diagram illustrating transmittance-wavelength characteristics of a first coloring layer and the like illustrated in FIG. 1.
Figure 3:
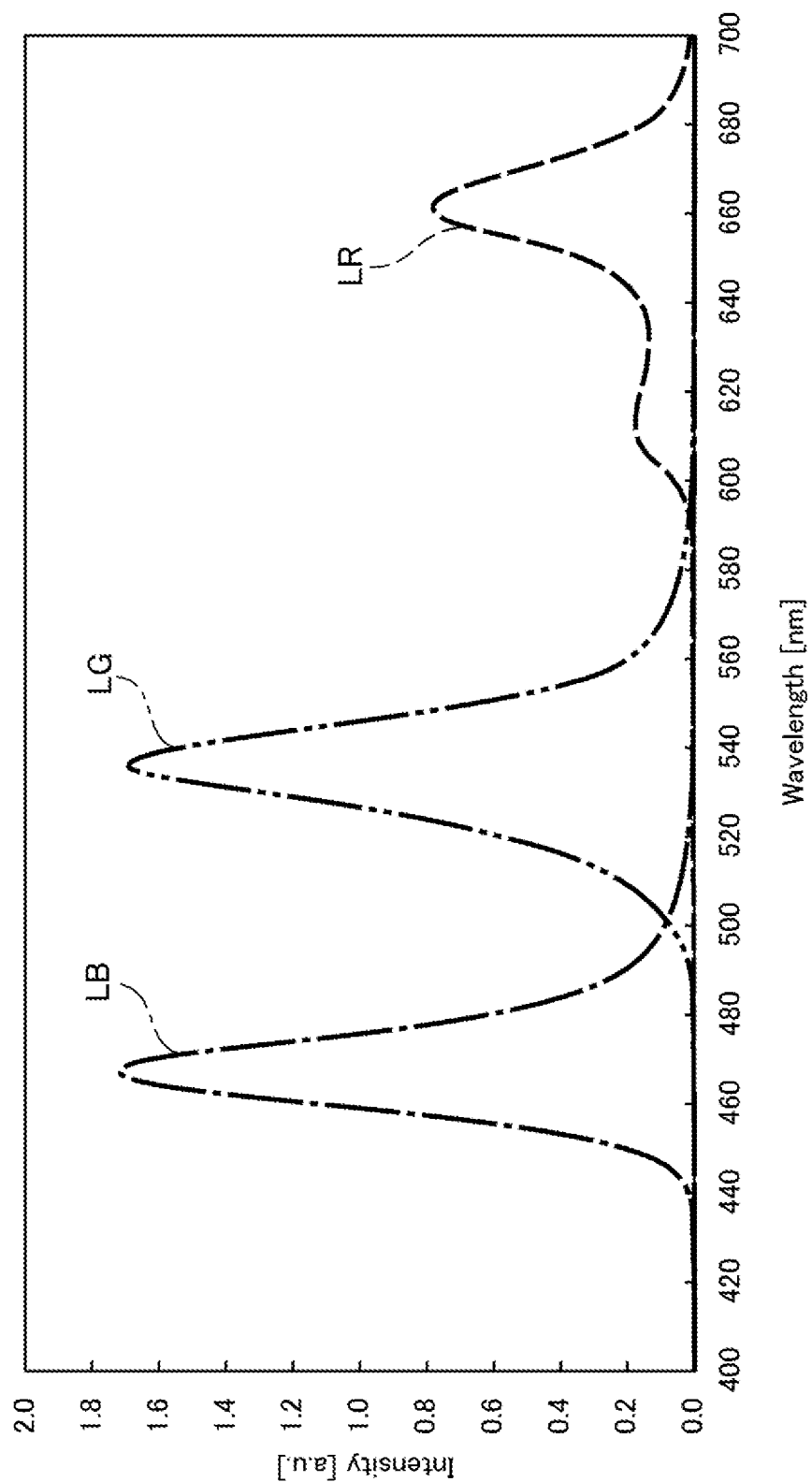
FIG. 3 is an explanatory diagram illustrating a spectrum of first image light and the like illustrated in FIG. 1.

FIG. 1 is a plan view of an optical unit 1 according to First Exemplary Embodiment of the invention. FIG. 2 is an explanatory diagram illustrating transmittance-wavelength characteristics of a first coloring layer 81(R) and the like illustrated in FIG. 1. FIG. 3 is an explanatory diagram illustrating a spectrum of first image light LR and the like illustrated in FIG. 1. As illustrated in FIG. 1, the optical unit 1 includes a first panel 10 provided with a plurality of first light-emitting elements 15 in a first display region 111 that is a display region of a first substrate 11, a second panel 20 provided with a plurality of second light-emitting elements 25 in a second display region 211 that is a display region of a second substrate 21, a third panel 30 provided with a plurality of third light-emitting elements 35 in a display region 311 that is a display region of a third substrate 31, and a dichroic prism 50.

Image light emitted from the first panel 10 is incident on the dichroic prism 50 as the first image light LR of a first wavelength range. Image light emitted from the second panel 20 is incident on the dichroic prism 50 as second image light LB of a second wavelength range. Image light emitted from the third panel 30 is incident on the dichroic prism 50 as third image light LG of a third wavelength range. In the exemplary embodiment, the first panel 10 emits the first image light LR of the first wavelength range from the first display region 111. The second panel 20 emits the second image light LB of the second wavelength range from the second display region 211. The third panel 30 emits third image light LG of a third wavelength range from the third display region 311. In the exemplary embodiment, the first wavelength range is from 620 nm to 750 nm, for example, and the first panel 10 emits the red color first image light LR. The second wavelength range is from 450 nm to 495 nm, for example, and the second panel 20 emits the blue color second image light LB. The third wavelength range is from 495 nm to 570 nm, for example, and the third panel 30 emits the green color third image light LG. In the exemplary embodiment, the first image light LR, the second image light LB, and the third image light LG are non-polarized light. However, the first image light LR, the second image light LB, and the third image light LG may be polarized light.

In the exemplary embodiment, as white light is emitted from the plurality of first light-emitting elements 15 provided in the first display region 111, in the first substrate 11, the first panel 10 is provided with, on the dichroic prism 50 side of the first light-emitting elements 15, a first coloring layer 81(R) that colors the image light, emitted from the first light-emitting elements 15, to be the first image light LR of the first wavelength range. As white light is emitted from the plurality of second light-emitting elements 25 provided in the second display region 211, in the second substrate 21, the second panel 20 is provided with, on the dichroic prism 50 side of the second light-emitting elements 25, a second coloring layer 81(B) that colors the image light emitted from the second light-emitting elements 25 to be the second image light LB of the second wavelength range. As white light is emitted from the plurality of third light-emitting elements 35 provided in the third display region 311, in the third substrate 31, the third panel 30 is provided with, on the dichroic prism 50 side of the third light-emitting elements 35, a third coloring layer 81(G) that colors the image light emitted from the third light-emitting elements 35 to be the third image light LG of the third wavelength range. In the exemplary embodiment, the first light-emitting elements 15, the second light-emitting elements 25, and the third light-emitting elements 35 are all the organic electroluminescent elements.

In the exemplary embodiment, the first coloring layer 81(R) has the transmittance-wavelength characteristics indicated by a dashed line P81(R) in FIG. 2, and is a light-absorbing filter layer that absorbs light other than the red light. The second coloring layer 81(B) has the transmittance-wavelength characteristics indicated by a one-dot chain line P81(B) in FIG. 2, and is a light absorbing filter layer that absorbs light other than the blue light. The third coloring layer 81(G) has the transmittance-wavelength characteristics indicated by a two-dot chain line P81(G) in FIG. 2, and is a light absorbing filter layer that absorbs light other than the green light. Thus, the first image light LR has a spectrum indicated by a dashed line LR in FIG. 3, the second image light LB has a spectrum indicated by a one-dot chain line LB in FIG. 3, and the third image light LG has a spectrum indicated by a two-dot chain line LG in FIG. 3.

The dichroic prism 50 includes a first incident surface 51, a second incident surface 52 that faces the first incident surface 51, a third incident surface 53 that is provided between the first incident surface 51 and the second incident surface 52, and an emission surface 54 that faces the third incident surface 53. The first panel 10, the second panel 20, and the third panel 30 are arranged so as to face the first incident surface 51, the second incident surface 52, and the third incident surface 53, respectively. For example, the first panel 10 is arranged so as to face the first incident surface 51, and the image light emitted from the first panel 10 is incident on the first incident surface 51 as the first image light LR of the first wavelength range. The second panel 20 is arranged so as to face the second incident surface 52, and the image light emitted from the second panel 20 is incident on the second incident surface 52 as the second image light LB of the second wavelength range. The third panel 30 is arranged so as to face the third incident surface 53, and the image light emitted from the third panel 30 is incident on the third incident surface 53 as the third image light LG of the third wavelength range. In the exemplary embodiment, the first incident surface 51 and the first panel 10 are fixed by a transmissive adhesive layer 19, the second incident surface 52 and the second panel 20 are fixed by a transmissive adhesive layer 29, and the third incident surface 53 and the third panel 30 are fixed by a transmissive adhesive layer 39.

The dichroic prism 50 includes a first dichroic mirror 56, and a second dichroic mirror 57 that are arranged so as to intersect each other at a 45 degree angle.

Optical Characteristics of Dichroic Prism 50

Figure 4:
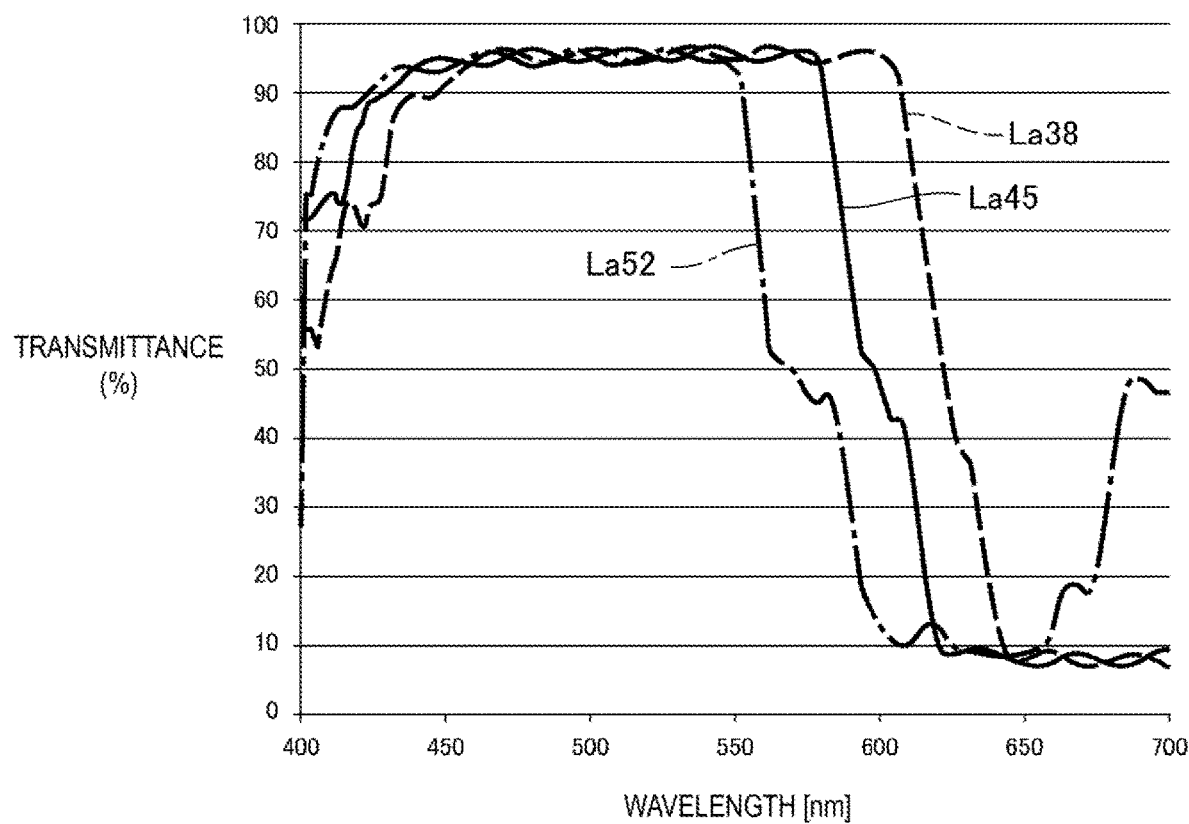
FIG. 4 is a graph illustrating transmittance-wavelength characteristics of a first dichroic mirror illustrated in FIG. 1.
Figure 5:
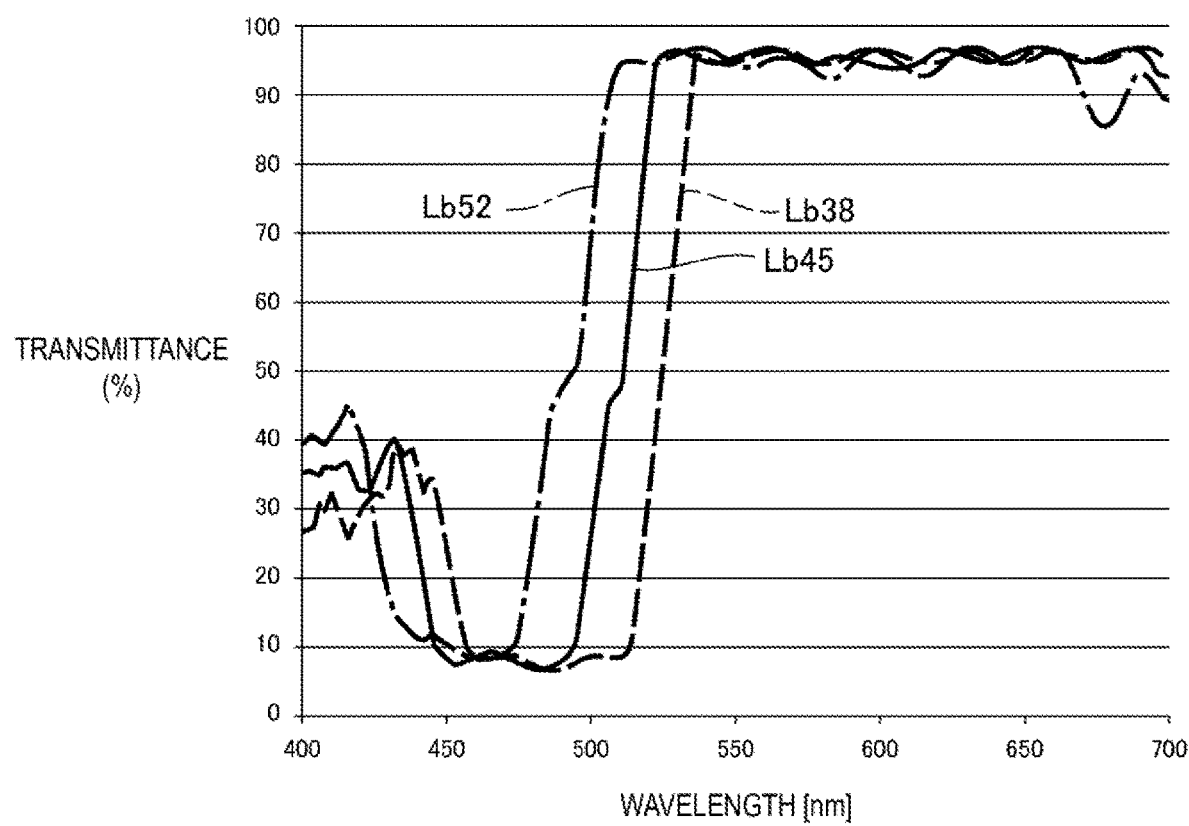
FIG. 5 is a graph illustrating transmittance-wavelength characteristics of a second dichroic mirror illustrated in FIG. 1.

FIG. 4 is a graph illustrating transmittance-wavelength characteristics of the first dichroic mirror 56 illustrated in FIG. 1. FIG. 5 is a graph illustrating transmittance-wavelength characteristics of the second dichroic mirror 57 illustrated in FIG. 1.

As indicated by a solid line La45 in FIG. 4, with regard to light that is incident at the 45 degree angle, the first dichroic mirror 56 transmits the light having a wavelength of 550 nm or less and reflects the light having a wavelength of 600 nm or greater. Further, with regard to the light having a wavelength from 550 nm to 600 nm, the longer the wavelength, the lower the transmittance. Thus, the first dichroic mirror 56 reflects the first image light LR toward the emission surface 54 and transmits the second image light LB and the third image light LG.

As indicated by a solid line Lb45 in FIG. 5, with regard to light that is incident at the 45 degree angle, the second dichroic mirror 57 transmits the light having a wavelength of 520 nm or greater and reflects the light having a wavelength of 490 nm or less. Further, with regard to the light having a wavelength from 490 nm to 520 nm, the longer the wavelength, the greater the transmittance. Thus, the second dichroic mirror 57 reflects the second image light LB toward the emission surface 54 and transmits the first image light LR and the third image light LG. Thus, the dichroic prism 50 emits, from the emission surface 54, a color image obtained by synthesizing the first image light LR emitted from the first panel 10, the second image light LB emitted from the second panel 20, and the third image light LG emitted from the third panel 30.

Note that the transmittance and the reflectance of the first dichroic mirror 56 are incident angle dependent. For example, with respect to the first dichroic mirror 56, as indicated by a dashed line La38 in FIG. 4, the wavelength range of transmission shifts more to the long wavelength side when the incident angle is 38 degrees than when the incident angle is 45 degrees, and as indicated by a one-dot chain line La52 in FIG. 4, the wavelength range of transmission shifts more to the short wavelength side when the incident angle is 52 degrees than when the incident angle is 45 degrees. Note that, similar to the first dichroic mirror 56, the transmittance and the reflectance of the second dichroic mirror 57 are incident angle dependent. For example, for the second dichroic mirror 57, as indicated by a dashed line Lb38 in FIG. 5, the wavelength range of transmission shifts more to the long wavelength side when the incident angle is 38 degrees than when the incident angle is 45 degrees, and as indicated by a one-dot chain line Lb52 in FIG. 5, the wavelength range of transmission shifts more to the short wavelength side when the incident angle is 52 degrees than when the incident angle is 45 degrees.

Electrical Configuration of First Panel 10

Figure 6:
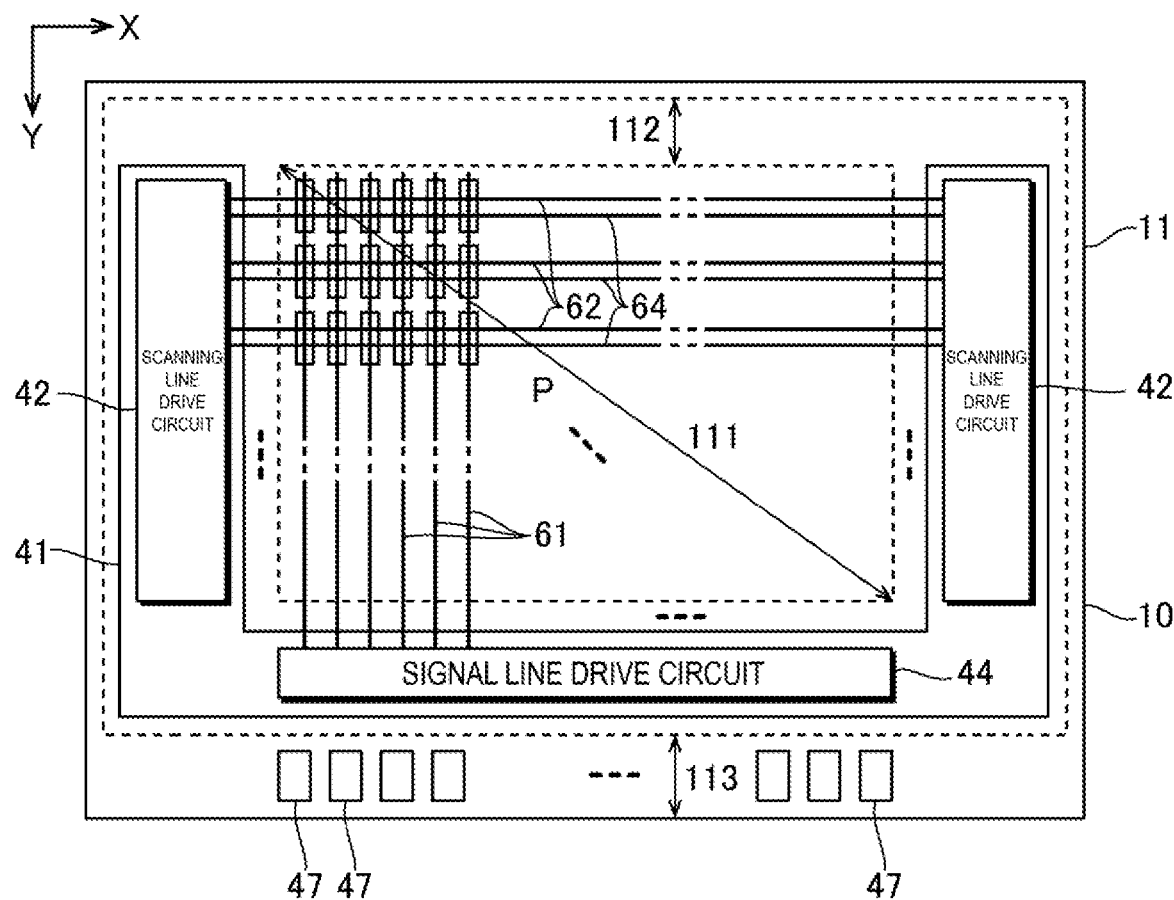
FIG. 6 is an explanatory diagram illustrating an electrical configuration of a first panel illustrated in FIG. 1.
Figure 7:
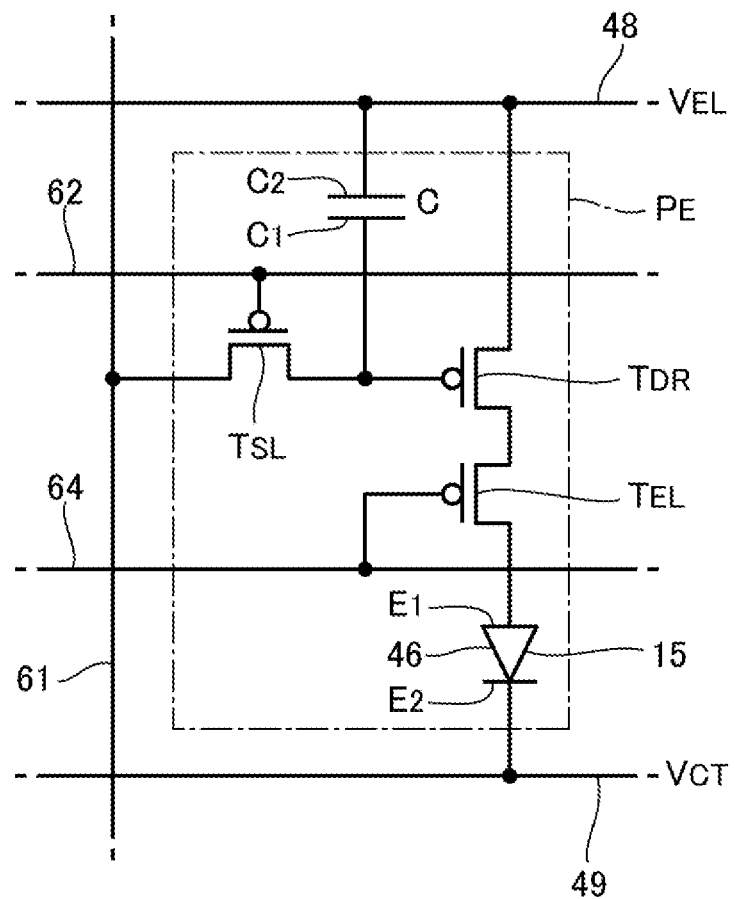
FIG. 7 is a circuit diagram of each of pixels (pixel circuits) in a first display region illustrated in FIG. 6.

FIG. 6 is an explanatory diagram illustrating an electrical configuration of the first panel 10 illustrated in FIG. 1. FIG. 7 is a circuit diagram of each of pixels (pixel circuits) in the first display region 111 illustrated in FIG. 6. Note that, in the following explanation, an "upper layer side" and an "upper surface" refer to an opposite side to the first substrate 11.

As illustrated in FIG. 6, in the first panel 10, the first display region 111, a peripheral region 112, and a mounting region 113 are provided on one surface of the first substrate 11. In the exemplary embodiment, the first substrate 11 is a silicon semiconductor substrate or the like. In the first substrate 11, the first display region 111 is a rectangular region in which a plurality of pixels P are arrayed. A plurality of scanning lines 62 that extend in an X direction, a plurality of control lines 64 that extend in the X direction in corresponding to each of the scanning lines 62, and a plurality of signal lines 61 that extend in a Y direction intersecting the X direction are formed in the first display region 111. The pixels P are formed corresponding to each intersection of the plurality of scanning lines 62 and the plurality of signal lines 61. Thus, the plurality of pixels P are arrayed in a matrix over the X direction and the Y direction.

The peripheral region 112 is a rectangular frame-shaped region that surrounds the periphery of the first display region 111. A drive circuit 41 is provided in the peripheral region 112. The drive circuit 41 is a circuit that drives each of the pixels P inside the first display region 111, and is configured so as to include two scanning line drive circuits 42 and a signal line drive circuit 44. The first panel 10 of the exemplary embodiment is a circuit incorporating display device in which the drive circuit 41 is configured by active elements, such as a transistor, formed directly on the surface of the first substrate 11.

The mounting region 113 is a region on the opposite side of the first display region 111 with the peripheral region 112 positioned therebetween, and a plurality of mounting terminals 47 are arrayed in the mounting region 113. Control signals and a power supply potential are supplied to each of the mounting terminals 47 from various external circuits such as a control circuit and a power supply circuit, which are not illustrated. The external circuits are mounted on a flexible circuit board, which is not illustrated, this flexible circuit board being bonded to the mounting region 113, for example.

As illustrated in FIG. 7, the pixel P is configured so as to include the first light-emitting element 15, a drive transistor TDR, a light emission control transistor TEL, a selection transistor TSL, and a capacitive element C. Note that, in FIG. 7, each of the transistors T (TDR, TEL, and TSL) of the pixel P, are p-channel type transistors, but n-channel type transistors can also be used.

The first light-emitting element 15 is an electro-optical element in which a light-emitting functional layer 46 that includes a light-emitting layer of an organic EL material is interposed between a first electrode E1 (a positive electrode) and a second electrode E2 (a negative electrode). The first electrode E1 is formed individually for each of the pixels P, and the second electrode E2 is continuous across the plurality of pixels P. The first light-emitting element 15 is arranged on a current path that couples a first power supply conductor 48 and a second power supply conductor 49. The first power supply conductor 48 is a power supply line to which a higher-side power supply potential (a first potential) VEL is supplied, and the second power supply conductor 49 is a power supply line to which a lower-side power supply potential (a second potential) VCT is supplied.

The drive transistor TDR and the light emission control transistor TEL are arranged on the current path, which couples the first power supply conductor 48 and the second power supply conductor 49, in series with the first light-emitting element 15. Specifically, one (the source) of a pair of current terminals of the drive transistor TDR is coupled to the first power supply conductor 48. The light emission control transistor TEL functions as a switch that controls a conductive state (conductive/non-conductive) between the other (the drain) of the pair of current terminals of the drive transistor TDR, and the first electrode E1 of the first light-emitting element 15. The drive transistor TDR generates a drive current of an amperage corresponding to a voltage between a gate and the source of the drive transistor TDR. In a state in which the light emission control transistor TEL is controlled to be ON, the drive current is supplied from the drive transistor TDR to the first light-emitting element 15 via the light emission control transistor TEL, and the light-emitting element 15 thus emits light at a luminance corresponding to the amperage of the drive current. In a state in which the light emission control transistor TEL is controlled to be OFF, the supply of the drive current to the first light-emitting element 15 is cut off, and the light-emitting element 15 is thus extinguished. A gate of the light emission control transistor TEL is coupled to the control line 64.

The selection transistor TSL functions as a switch that controls a conductive state (conductive/non-conductive) between the signal line 61 and the gate of the drive transistor TDR. A gate of the selection transistor TSL is coupled to the scanning line 62. Further, the capacitive element C is an electrostatic capacitance with a dielectric substance interposed between a first electrode C1 and a second electrode C2. The first electrode C1 is coupled to the gate of the drive transistor TDR, and the second electrode C2 is coupled to the first power supply conductor 48 (the source of the drive transistor TDR). Thus, the capacitive element C holds the voltage between the gate and source of the drive transistor TDR.

The signal line drive circuit 44 supplies a grayscale potential (a data signal) depending on a grayscale specified for each of the pixels P by an image signal supplied from an external circuit, to the plurality of signal lines 61, in parallel, for each write period (horizontal scanning period). Meanwhile, by supplying a scanning signal to each of the scanning lines 62, each of the scanning line drive circuits 42 sequentially selects each of the plurality of scanning lines 62 for each write period. The selection transistor TSL of each of the pixels P corresponding to the scanning line 62 selected by the scanning line drive circuits 42 switches to an ON state. Thus, the grayscale potential is supplied to the gate of the drive transistor TDR of each of the pixels P, via the signal line 61 and the selection transistor TSL, and the voltage according to the grayscale potential is held in the capacitive element C. Meanwhile, when the selection of the scanning lines 62 in the write period ends, each of the scanning line drive circuits 42 supplies a control signal to each of the control lines 64, thus controlling the light emission control transistor TEL of each of the pixels P corresponding to the control lines 64 to be in an ON state. Thus, a drive current that accords with the voltage held in the capacitive element C in the immediately preceding write period is supplied to the first light-emitting element 15 from the drive transistor TDR via the light emission control transistor TEL. In this way, the first light-emitting element 15 emits light at a luminance that accords with the grayscale potential. As a result, the desired first image light LR specified by the image signal is emitted from the first display region 111.

Cross-Sectional Configuration of First Panel 10

Figure 8:
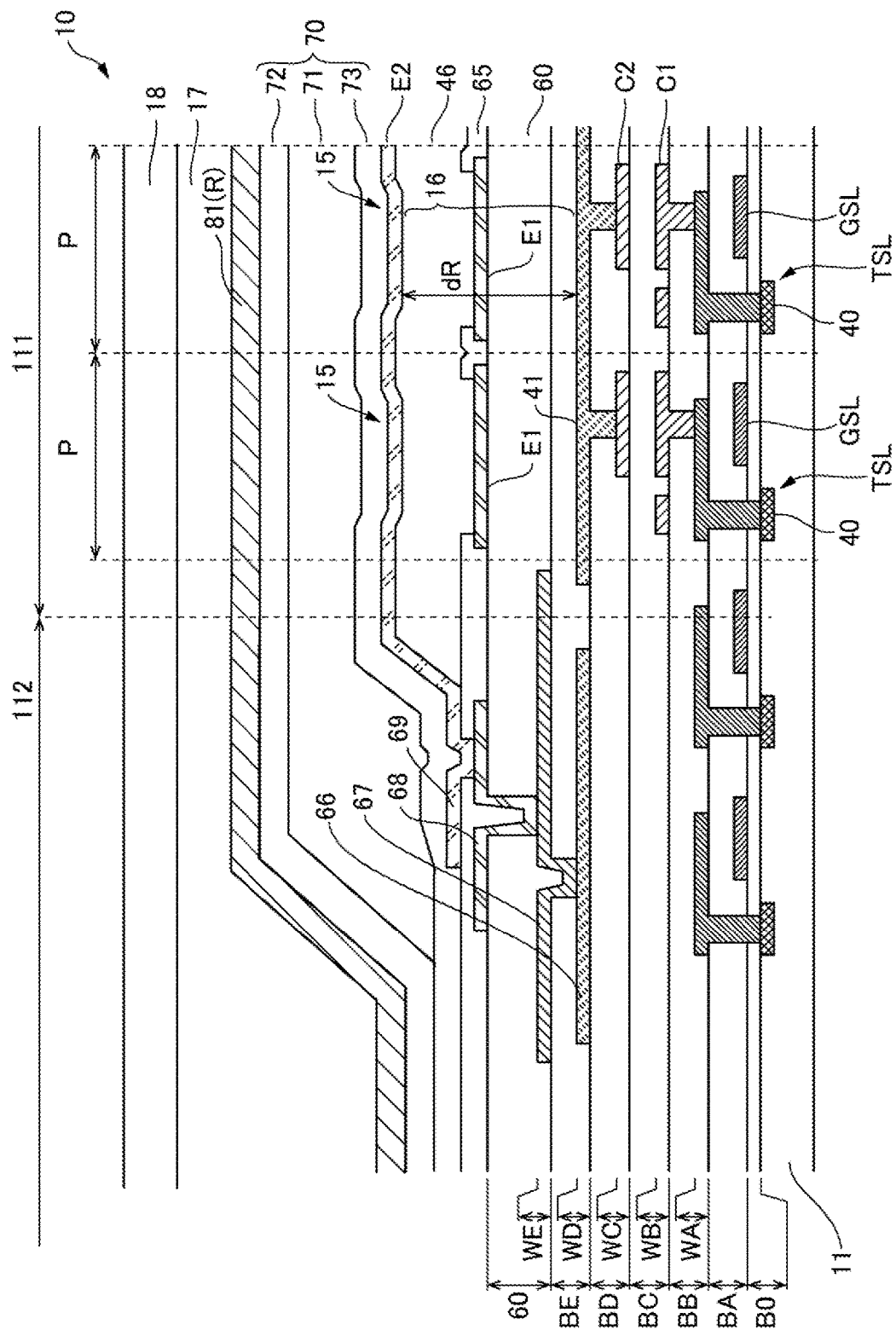
FIG. 8 is a cross-sectional view of the first panel illustrated in FIG. 1.

FIG. 8 is a cross-sectional view of the first panel 10 illustrated in FIG. 1. As illustrated in FIG. 8, a transistor active region 40 (a source/drain region) for, for example, the selection transistor TSL of the pixel P, is formed on the first substrate 11, and the upper surface of the active region 40 is covered by an insulating film B0 (a gate insulating film). A gate electrode G is formed on the upper surface of the insulating film B0. A multilayer wiring layer, in which a plurality of insulating layers BA to BE and a plurality of wiring layers WA to WE are alternately laminated, is formed on the upper layer side of the gate electrode G. Each of the wiring layers is formed of a low-resistance conductive material that contains aluminum, silver, or the like. The wiring layer WA that includes the scanning lines 62 and the like illustrated in FIG. 7 is formed on the upper surface of the insulating film BA. The wiring layer WB that includes the signal lines 61, the first electrodes C1 and the like illustrated in FIG. 7 is formed on the upper layer of the insulating layer BB. The wiring layer WC that includes the second electrodes C2 and the like illustrated in FIG. 7 is formed on the surface layer of the insulating layer BC. The wiring layer WD that includes the first power supply conductors 48 and the like illustrated in FIG. 7 is formed on the surface layer of the insulating layer BD. The wiring layer WE that includes wiring 69, wiring 67 and the like is formed on the upper layer of the insulating layer BE.

An optical path adjusting layer 60 is formed on the upper layer of the insulating layer BE. The optical path adjusting layer 60 is an element used to set a resonance wavelength of an optical resonator 16 (a first optical resonator) to a red wavelength, and is formed of a light-transmissive insulating material of silicon nitride, silicon oxide or the like. Specifically, by appropriately adjusting an optical path length dR (an optical distance) between the first power supply conductor 48 and the second electrode E2 that configure the optical resonator 16, in accordance with a film thickness of the optical path adjusting layer 60, the resonance wavelength is set with respect to the light emitted from the first panel 10. In the exemplary embodiment, since the red first image light LR is emitted from the first panel 10, the optical path length of the optical resonator 16 is set to a value appropriate for the first image light LR. Thus, the optical resonator 16 generally has the same transmittance-wavelength characteristics (refer to FIG. 2) as the first coloring layer 81(R) illustrated in FIG. 1.

The first electrode E1 is formed on the upper surface of the optical path adjusting layer 60, for each of the pixels P in the first display region 111. The first electrode E1 is formed of a light-transmissive conductive material, such as indium tin oxide (ITO), for example. An insulating pixel defining layer 65 is formed around the first electrode E1. The light-emitting functional layer 46 is formed on the upper surface of the first electrode E1. The light-emitting functional layer 46 is configured to contain the light-emitting layer formed of the organic EL material, and irradiates white light as a result of the supply of current. A transport layer or an injection layer of electrons or positive holes supplied to the light-emitting layer may be provided in the light-emitting functional layer 46. The light-emitting functional layer 46 is formed continuously over the plurality of pixels P in the first display region 111.

The second electrode E2 is formed on the upper layer of the light-emitting functional layer 46, over the entire area of the first display region 111, and, of the light-emitting functional layer 46, a region (a light-emitting region sandwiched between the first electrode E1 and the second electrode E2 emits light. The second electrode E2 transmits some of the light that has reached it, and also functions as a semitransparent reflection layer that reflects back the rest of the light. For example, by forming a photoreflective conductive material, such as an alloy containing silver or magnesium, into a sufficiently thin film, the semitransparent reflective electrode E2 is formed. The radiated light from the light-emitting functional layer 46 reciprocates between the first power supply conductor 48 and the second electrode E2, and components of a particular resonance wavelength are selectively amplified. Then, the reciprocating light passes through the second electrode E2 and is emitted to an observation side (the opposite side to the first substrate 11). In other words, the optical resonator 16 is formed that causes the light emitted from the light-emitting functional layer 46 to resonate between the first power supply conductor 48 that functions as the reflection layer and the second electrode E2 that functions as the semitransparent reflection layer.

Here, in the peripheral region 112, the wirings 66, 67, 68, 69, and the like are formed in the same layers as the conductive layers formed in the first display region 111, and the wirings 66, 67, 68, and 69 are electrically coupled via contact holes of the insulating layers formed between the wirings, for example.

A sealing body 70 is formed on the upper layer side of the second electrode E2, over the entire area of the first substrate 11. The sealing body 70 is a light-transmissive film body that seals each of the elements formed on the first substrate 11 and prevents the infiltration of outside air and moisture, and is configured by a laminated film of a first sealing layer 71, a second sealing layer 72, and a third sealing layer 73, for example. The third sealing layer 73 is formed on the upper layer of the second electrode E2 and is in direct contact with the upper surface of the second electrode E2. The third sealing layer 73 is an insulating inorganic material such as a silicon compound (typically, silicon nitride or silicon oxide), for example. The first sealing layer 71 functions as a flattening film that buries level differences of the surface of the second electrode E2 and the third sealing layer 73. The first sealing layer 71 is formed of a light-transmissive organic materials, such as an epoxy resin, for example. The second sealing layer 72 is formed over the entire area of the first substrate 11. The second sealing layer 72 is formed of a silicon nitride compound, a silicon oxide compound, or the like, for example, which offer excellent water-resistant and heat-resistant properties.

The first coloring layer 81(R) is formed on the upper surface of the sealing body 70 (the second sealing layer 72), over the entire region or substantially the entire region of the first display region 111 and the peripheral region 112. The first coloring layer 81(R) transmits the red light of the first wavelength range. Further, in the first panel 10, a transmissive cover substrate 18 is fixed by an adhesive layer 17 on the opposite side of the first coloring layer 81(R) to the first substrate 11 (i.e., on the dichroic prism 50 side).

Configurations of Second Panel 20 and Third Panel 30

Figure 9:
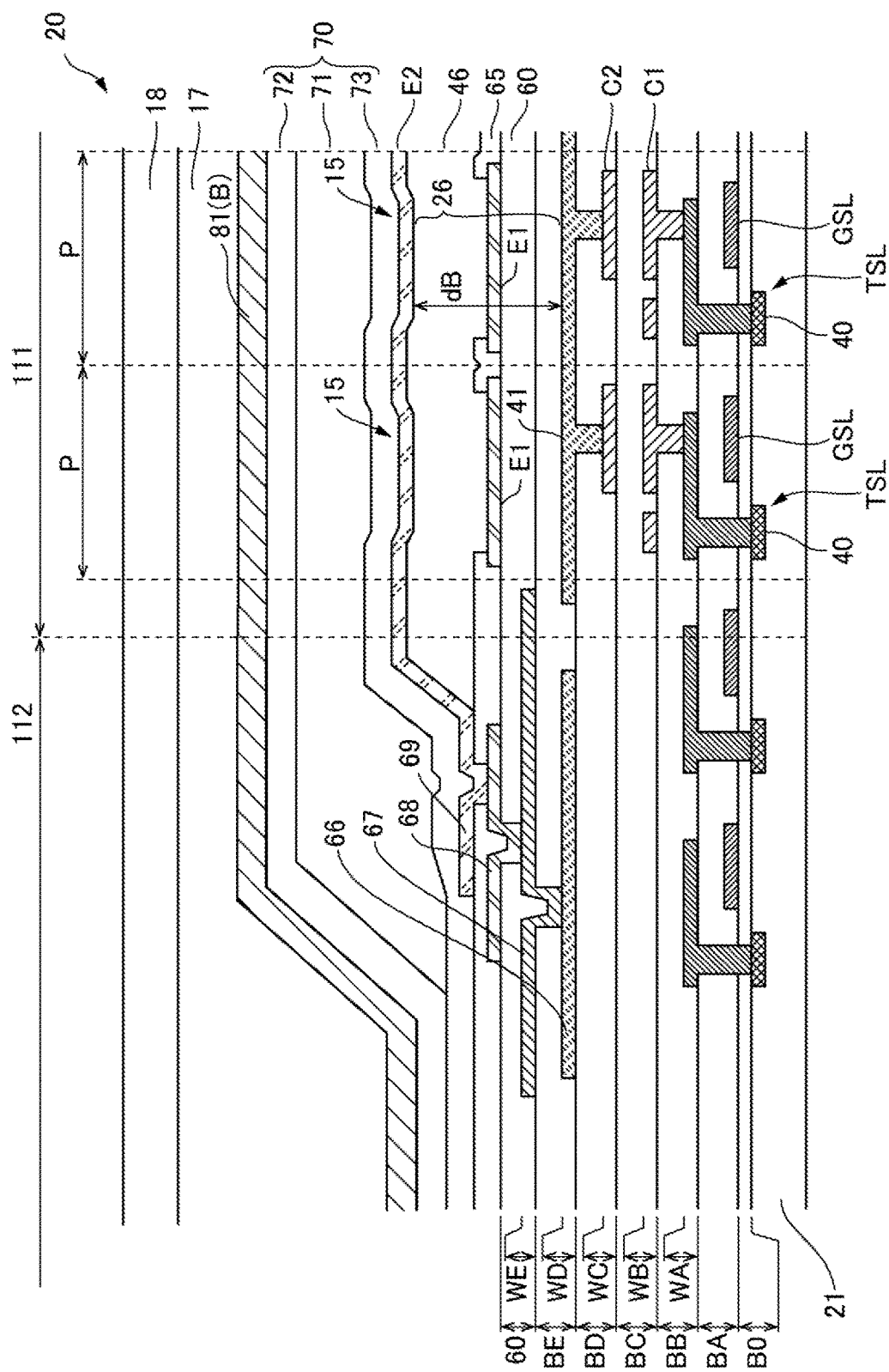
FIG. 9 is a cross-sectional view of a second panel illustrated in FIG. 1.
Figure 10:
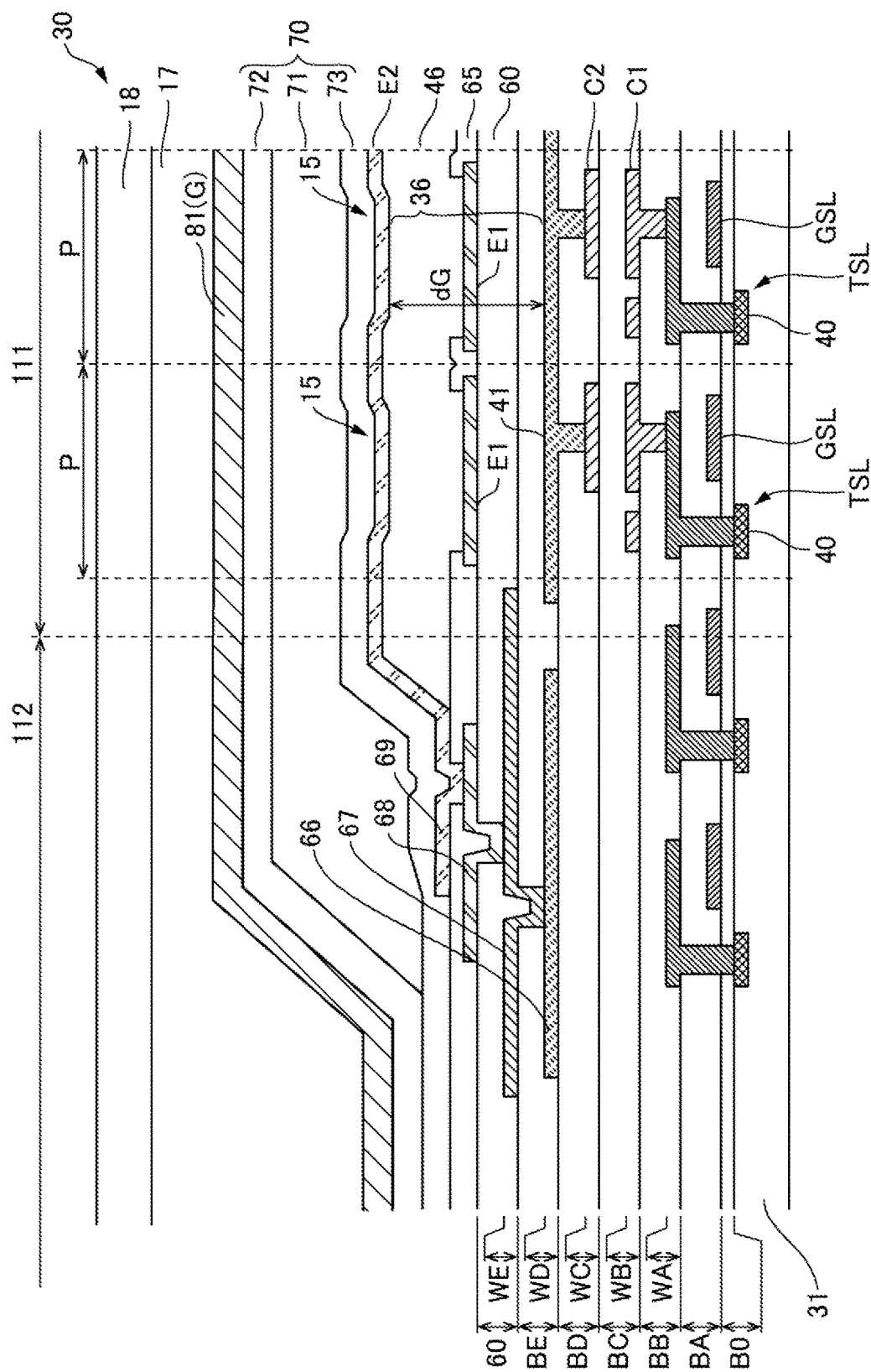
FIG. 10 is a cross-sectional view of a third panel illustrated in FIG. 1.

FIG. 9 is a cross-sectional view of the second panel 20 illustrated in FIG. 1. FIG. 10 is a cross-sectional view of the third panel 30 illustrated in FIG. 1. Similar to the first panel 10, the second panel 20 and the third panel 30 illustrated in FIG. 1 have the electrical configuration explained with reference to FIG. 6 and FIG. 7, and the second light-emitting elements 25 and the third light-emitting elements 35 are formed in place of the first light-emitting elements 15.

As illustrated in FIG. 9, in the second panel 20, in place of the first coloring layer 81(R) explained with reference to FIG. 8, the second coloring layer 81(B) is formed over the entire region or substantially the entire region of the second display region 211 and the peripheral region 212, and the second coloring layer 81(B) transmits the blue light of the second wavelength range. Further, the film thickness of the optical path adjusting layer 60 illustrated in FIG. 9 is adjusted to correspond to the wavelength of the blue second image light LB emitted from the second panel 20, and an optical path length dB (the optical distance) between the first power supply conductor 48 and the second electrode E2 that configure an optical resonator 26 (a second optical resonator) is optimized. Thus, the optical resonator 26 generally has the same transmittance-wavelength characteristics (refer to FIG. 2) as the second coloring layer 81(B) illustrated in FIG. 1. Further, in the second panel 20, a transmissive cover substrate 28 is fixed by an adhesive layer 27 on the opposite side of the second coloring layer 81(B) to the second substrate 21 (i.e., on the dichroic prism 50 side).

As illustrated in FIG. 10, in the third panel 30, in place of the first coloring layer 81(R) explained with reference to FIG. 8, the third coloring layer 81(G) is formed over the entire region or substantially the entire region of the display region 311 and the peripheral region 312, and the third coloring layer 81(G) transmits the green light of the third wavelength range. Further, the film thickness of the optical path adjusting layer 60 illustrated in FIG. 10 is adjusted to correspond to the wavelength of the green third image light LG emitted from the third panel 30, and an optical path length dG (the optical distance) between the first power supply conductor 48 and the second electrode E2 that configure an optical resonator 36 (a third optical resonator) is optimized. Thus, the optical resonator 36 generally has the same transmittance-wavelength characteristics (refer to FIG. 2) as the third coloring layer 81(G) illustrated in FIG. 1. Further, in the third panel 30, a transmissive cover substrate 38 is fixed by an adhesive layer 37 with respect to the third coloring layer 81(G), on the opposite side to the third substrate 31 (the side of the dichroic prism 50).

Configuration of Color Filter 80

Figure 11:
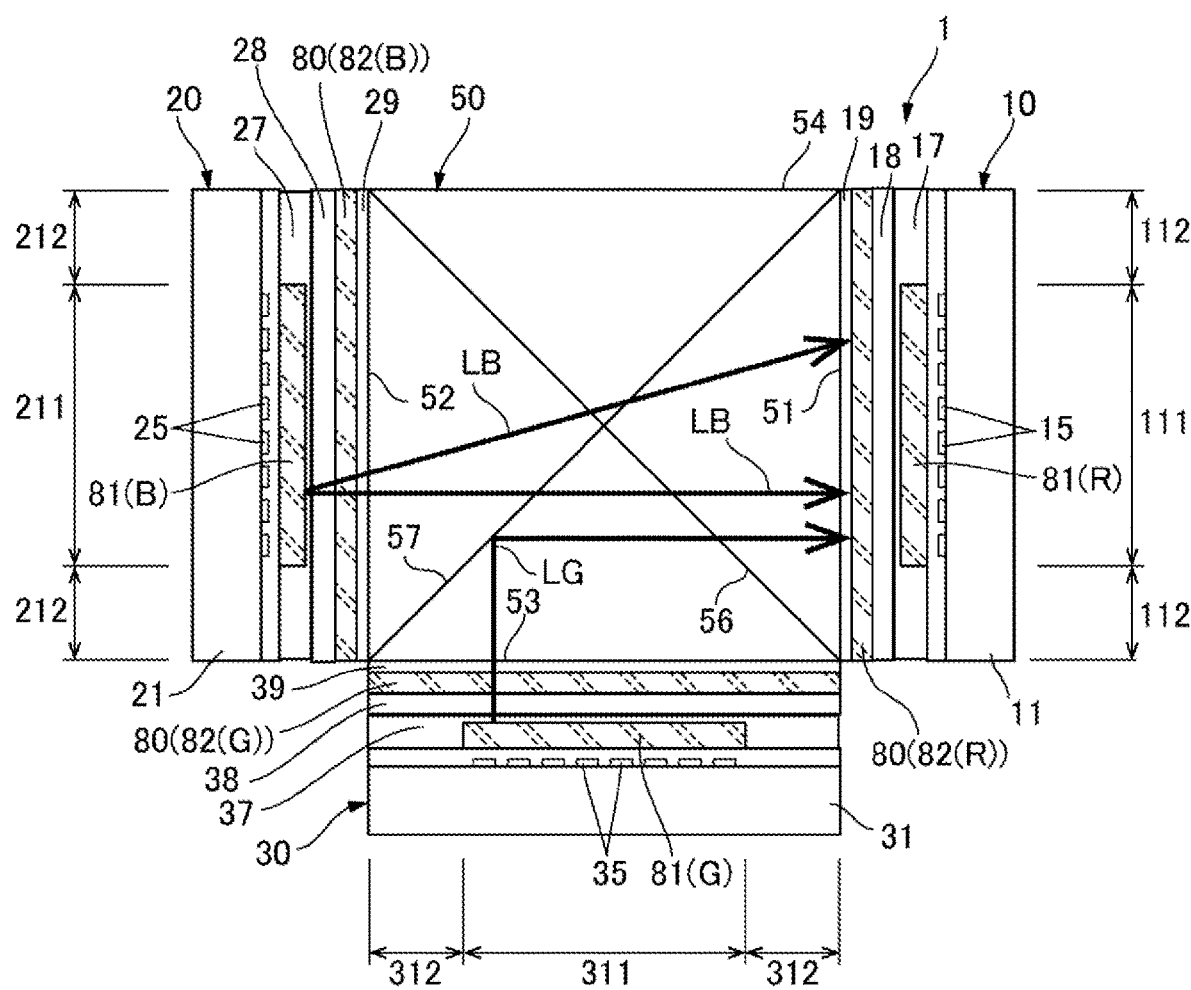
FIG. 11 is an explanatory diagram illustrating effects and the like of a color filter illustrated in FIG. 1.

FIG. 11 is an explanatory diagram illustrating effects and the like of a color filter 80 illustrated in FIG. 1. Returning once again to FIG. 1, the optical unit 1 of the exemplary embodiment uses the light (the first image light LR, the second image light LB, and the third image light LG) emitted from the light-emitting elements (the first light-emitting elements 15, the second light-emitting elements 25, and the third light-emitting elements 35), such as the organic electroluminescent elements. Thus, the first image light LR, the second image light LB, and the third image light LG include the oblique light that is significantly inclined with respect to the device optical axis. Further, the dichroic mirrors (the first dichroic mirror 56 and the second dichroic mirror 57) of the dichroic prism 50 do not have 100% transmittance or reflectance. Further, the dichroic mirrors (the first dichroic mirror 56 and the second dichroic mirror 57) of the dichroic prism 50 have incident angle dependence. Thus, in the dichroic prism 50, while some of the color light that should be reflected passes through the dichroic mirrors, some of the color light to pass through is reflected by the dichroic mirrors, and unwanted light may be generated.

Here, in the optical unit 1 of the exemplary embodiment, between any one of the light-emitting elements among the first light-emitting elements 15, the second light-emitting elements 25, and the third light-emitting elements 35, and the dichroic prism 50, the color filter 80 is provided, and the color filter 80 that selectively transmits the image light of the wavelength range incident on the dichroic prism 50 from the panels is provided.

In the exemplary embodiment, the color filters 80 are provided between the display region and the dichroic prism 50 in all of the first panel 10, the second panel 20, and the third panel 30. Specifically, the color filters 80 are provided as a first color filter 82(R) between the first light-emitting elements 15 and the dichroic prism 50, as a second color filter 82(B) between the second light-emitting elements 25 and the dichroic prism 50, and as a third color filter 82(G) between the third light-emitting elements 35 and the dichroic prism 50. Here, the first color filter 82(R) is a light-absorbent filter layer configured from the same material as that of the first coloring layer 81(R), and has the transmittance-wavelength characteristics indicated by the dashed line P81(R) in FIG. 2. The second color filter 82(B) is a light-absorbent filter layer configured from the same material as that of the second coloring layer 81(B), and has the transmittance-wavelength characteristics indicated by the one-dot chain line P81(B) in FIG. 2. The third color filter 82(G) is a light-absorbent filter layer configured from the same material as that of the third coloring layer 81(G), and has the transmittance-wavelength characteristics indicated by the two-dot chain line P81(G) in FIG. 2.

In realizing the above-described configuration, the first color filter 82(R) is configured integrally with the first panel 10, the second color filter 82(B) is configured integrally with the second panel 20, and the third color filter 82(G) is configured integrally with the third panel 30. More specifically, the first color filter 82(R) is formed on the cover substrate 18, the second color filter 82(B) is formed on the cover substrate 28, and the third color filter 82(G) is formed on the cover substrate 38. In FIG. 1, a mode is illustrated in which the first color filter 82(R), the second color filter 82(B), and the third color filter 82(G) are formed on surfaces of the cover substrates 18, 28, and 38 on the dichroic prism 50 side. However, a mode may be adopted in which the first color filter 82(R), the second color filter 82(B), and the third color filter 82(G) are formed on surfaces of the cover substrates 18, 28, and 38 on the opposite side to the dichroic prism 50.

In the optical unit 1 configured in this way, as illustrated in FIG. 11, even when, in the dichroic prism 50, part of the color light that should be reflected has passed through the dichroic mirrors (the first dichroic mirror 56 and the second dichroic mirror 57) as the unwanted light, or when part of the color light that should be allowed to pass through is reflected by the dichroic mirrors (the first dichroic mirror 56 and the second dichroic mirror 57) and the unwanted light is generated, this unwanted light is absorbed by the color filter 80 provided on the other panels. As a result, it is possible to suppress the unwanted light from being emitted from the emission surface 54 of the dichroic prism 50, and thus, when the optical unit 1 is used in a display device to be described later, it is possible to suppress the generation of ghosting or a deterioration in contrast caused by the unwanted light.

For example, even when a part of the second image light LB emitted from the second panel 20 is not reflected by the second dichroic mirror 57 and advances toward the first panel 10, this unwanted light is absorbed by the first color filter 82(R) provided between the dichroic prism 50 and the first panel 10. Further, even when a part of the third image light LG emitted from the third panel 30 does not pass through the second dichroic mirror 57 and is reflected, this unwanted light is absorbed by the first color filter 82(R) provided between the dichroic prism 50 and the first panel 10.

Further, in the exemplary embodiment, as described with reference to FIG. 8, FIG. 9, and FIG. 10, the optical resonators 16, 26, and 36 are formed on the first panel 10, the second panel 20, and the third panel 30. Thus, even when part of the unwanted light passes through the color filter 80, this light is attenuated in the optical resonators 16, 26, and 36, and is not easily emitted from the first panel 10, the second panel 20, and the third panel 30. As a result, it is possible to suppress the unwanted light from being emitted from the emission surface 54 of the dichroic prism 50, and thus, when the optical unit 1 is used in the display device to be described later, it is possible to suppress the generation of ghosting or the deterioration in contrast caused by the unwanted light.

Configuration of Color Filter 80

Figure 12:
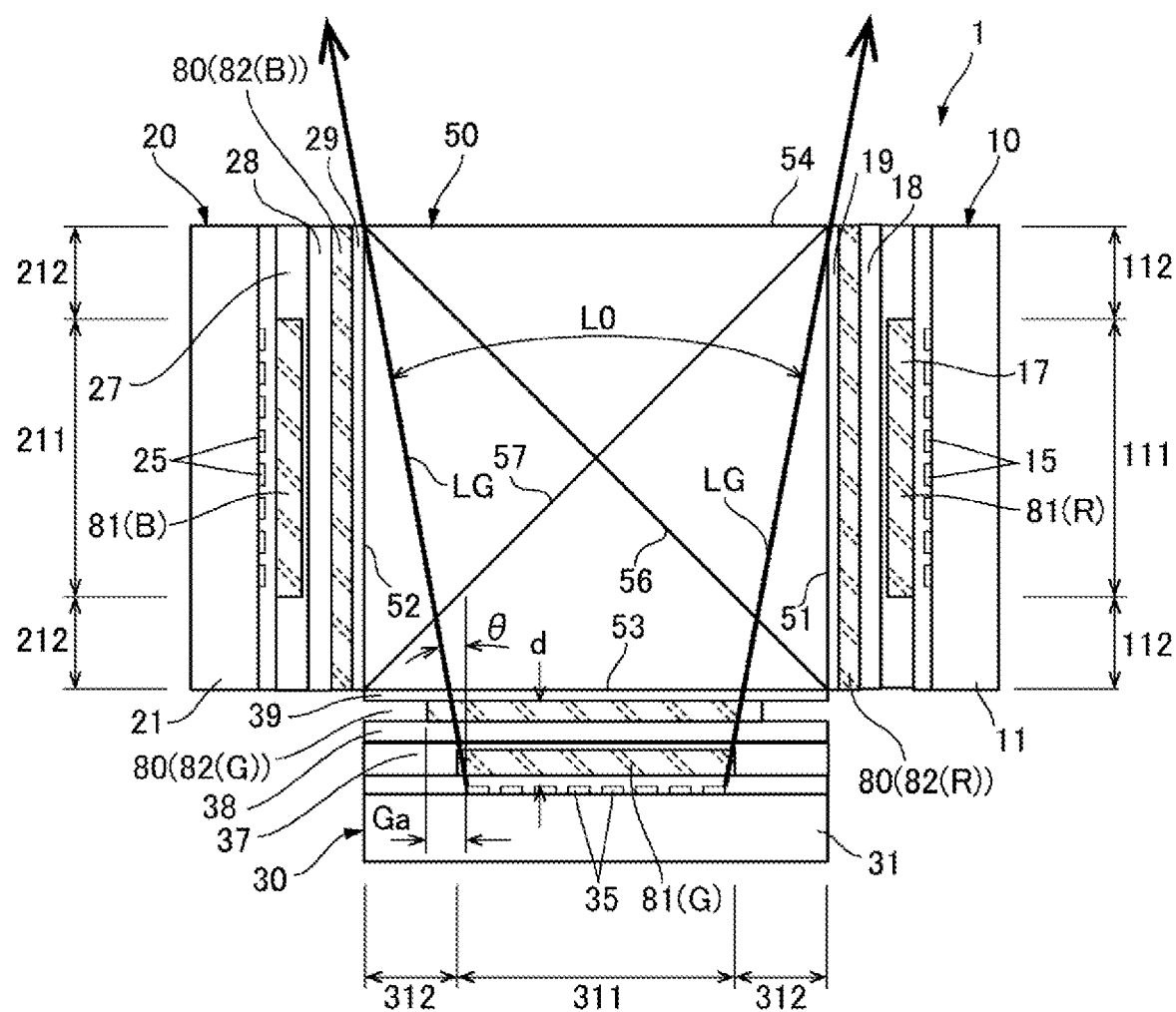
FIG. 12 is an explanatory diagram illustrating a first example of a forming range of the color filter in the optical unit to which the invention is applied.
Figure 13:
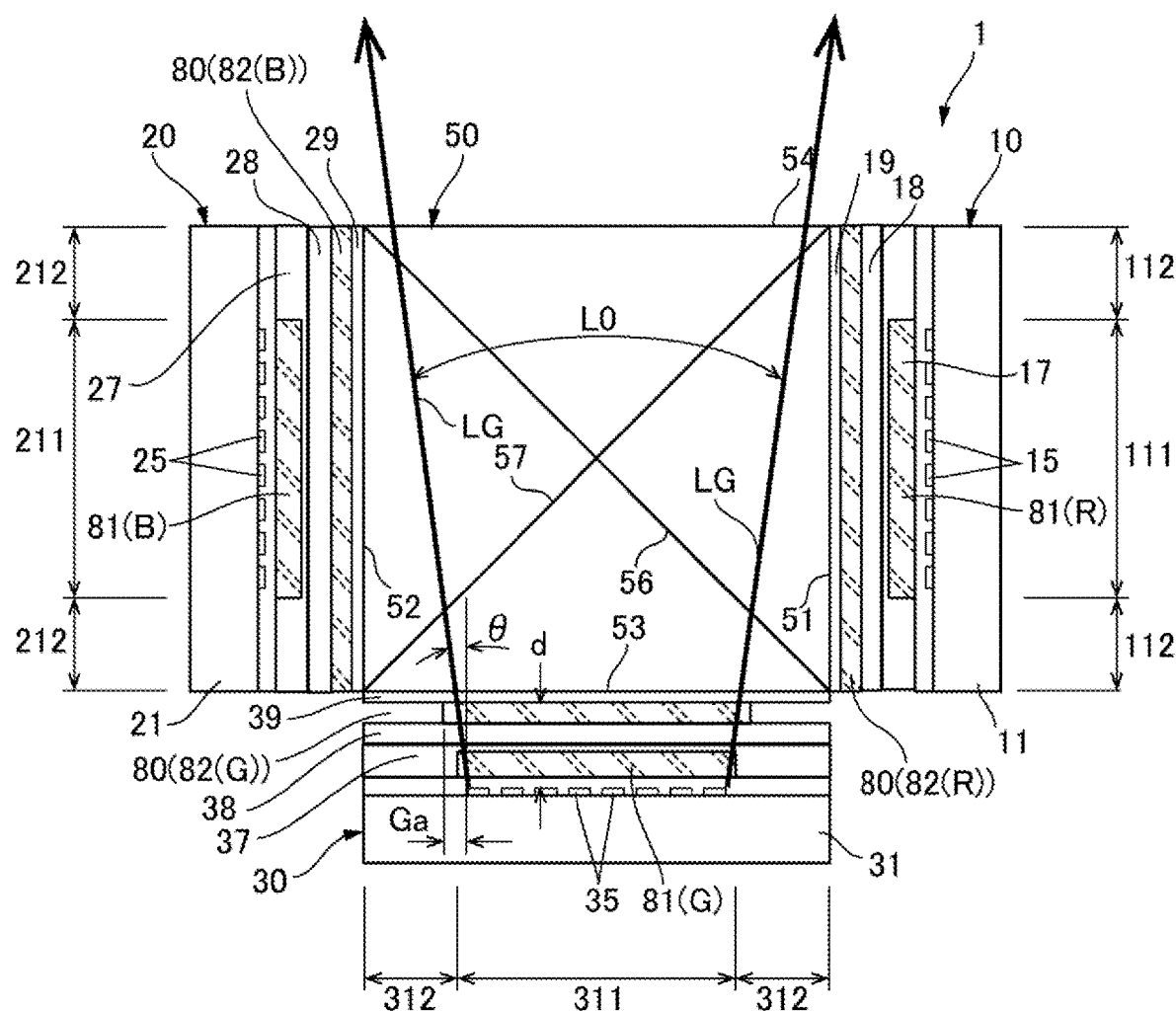
FIG. 13 is an explanatory diagram illustrating a second example of the forming range of the color filter in the optical unit to which the invention is applied.

FIG. 12 is an explanatory diagram illustrating a first example of a forming range of the color filter 80 in the optical unit 1 to which the invention is applied. FIG. 13 is an explanatory diagram illustrating a second example of the forming range of the color filter 80 in the optical unit 1 to which the invention is applied. Thus, as illustrated in FIG. 12, and when explained taking the third image light LG emitted from the third panel 30 as an example, the color filter 80 is preferably provided at least in a region, through which an effective luminous flux L0 corresponding to a luminous flux emitted from the emission surface 54 passes, of a luminous flux of the third image light LG emitted toward the dichroic prism 50 from the third display region 311 of the third substrate 31.

For example, when an angle between a ray of light positioned at the end of the effective luminous flux L0 and a normal line with respect to the third incident surface 53 is θ, a distance in the direction of the normal line with respect to the third incident surface 53 from the third light-emitting element 35 to the surface of the color filter 80 on the dichroic prism 50 side is d, and an interval between an edge of the color filter 80, when seen from the direction of the normal line with respect to the third incident surface 53, and the third light-emitting element 35 positioned on an end portion of the third display region 311 is Ga, the angle θ, the distance d, and the interval Ga preferably satisfy the following condition.

$Ga > d * \tan \theta$

Further, as illustrated in FIG. 13, the color filter 80 is preferably provided at least in a region, through which the effective luminous flux L0 that is used in the display of the image passes, of the luminous flux emitted from the emission surface 54. For example, the angle θ between the ray of light positioned at the end of the effective luminous flux L0 and the normal line with respect to the third incident surface 53, the distance d in the direction of the normal line with respect to the third incident surface 53 from the third light-emitting element 35 to the surface of the color filter 80 on the dichroic prism 50 side, and the interval Ga between the color filter 80, when seen from the direction of the normal line with respect to the third incident surface 53, and the third light-emitting element 35 positioned on the end portion of the third display region 311 preferably satisfy the following condition.

$Ga > d * \tan \theta$

Second Exemplary Embodiment

Figure 14:
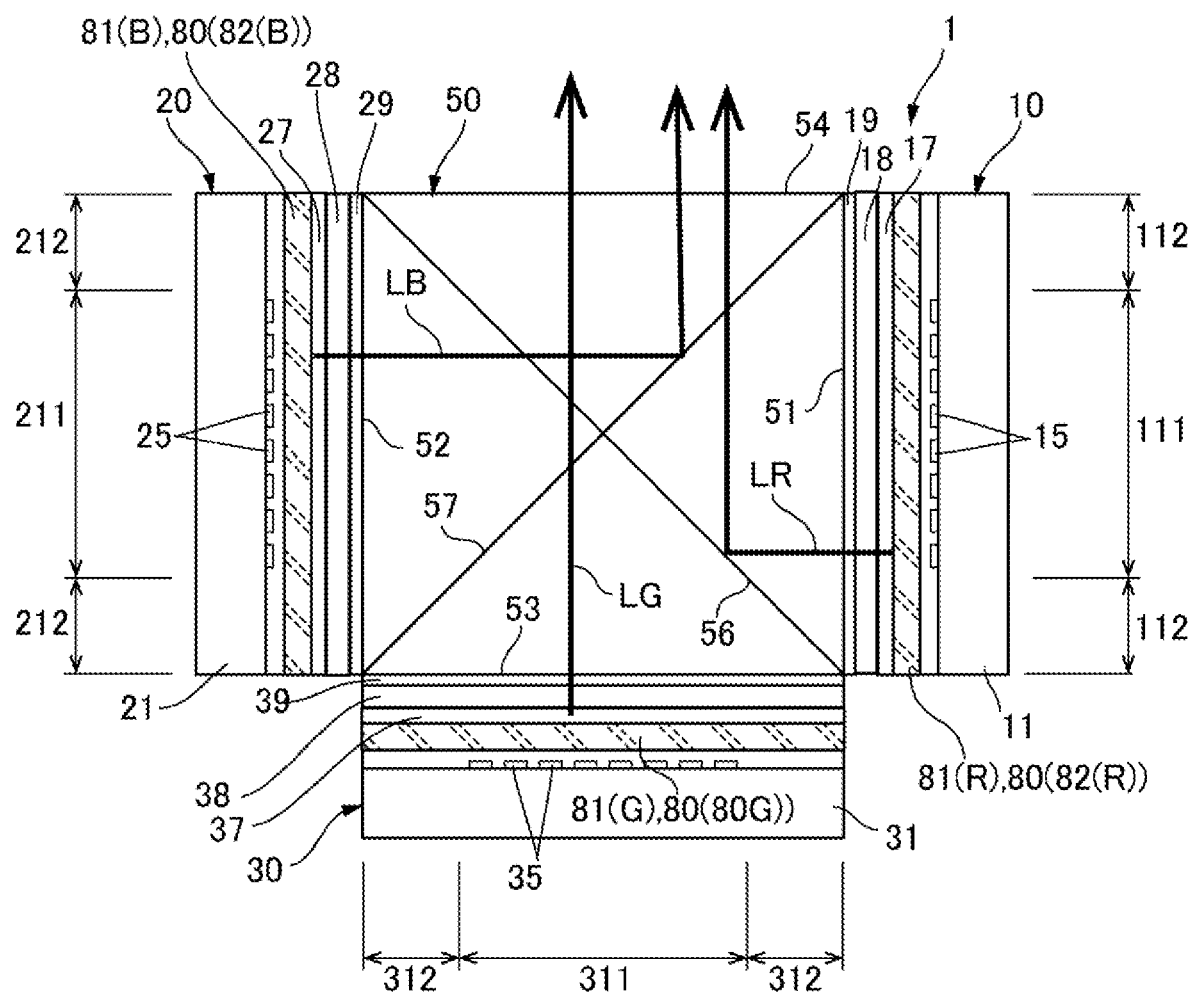
FIG. 14 is a plan view of the optical unit according to Second Exemplary Embodiment of the invention.

FIG. 14 is a plan view of the optical unit 1 according to Second Exemplary Embodiment of the invention. Note that the basic configuration of this exemplary embodiment and exemplary embodiments to be described later is the same as the configuration of First Exemplary Embodiment, and thus common portions have the same reference symbols and a description of the common portions will be omitted.

In First Exemplary Embodiment, both the coloring layer and the color filter are provided on each one of the panels, but in this exemplary embodiment, as illustrated in FIG. 14, the coloring layer of First Exemplary Embodiment is used as the color filter. Thus, the color filter and the coloring layer are formed as a single layer. More specifically, in the first panel 10, the light emitted from the plurality of first light-emitting elements 15 is colored by the first color filter 82(R) that also serves as the first coloring layer 81(R), and is incident on the dichroic prism 50 as the first image light LR of the first wavelength range. In the second panel 20, the light emitted from the plurality of second light-emitting elements 25 is colored by the second color filter 82(B) that also serves as the second coloring layer 81(B), and is incident on the dichroic prism 50 as the second image light LB of the second wavelength range. In the third panel 30, the light emitted from the plurality of third light-emitting elements 35 is colored by the third color filter 82(G) that also serves as the third coloring layer 81(G), and is incident on the dichroic prism 50 as the third image light LG of the third wavelength range.

Third Exemplary Embodiment

Figure 15:
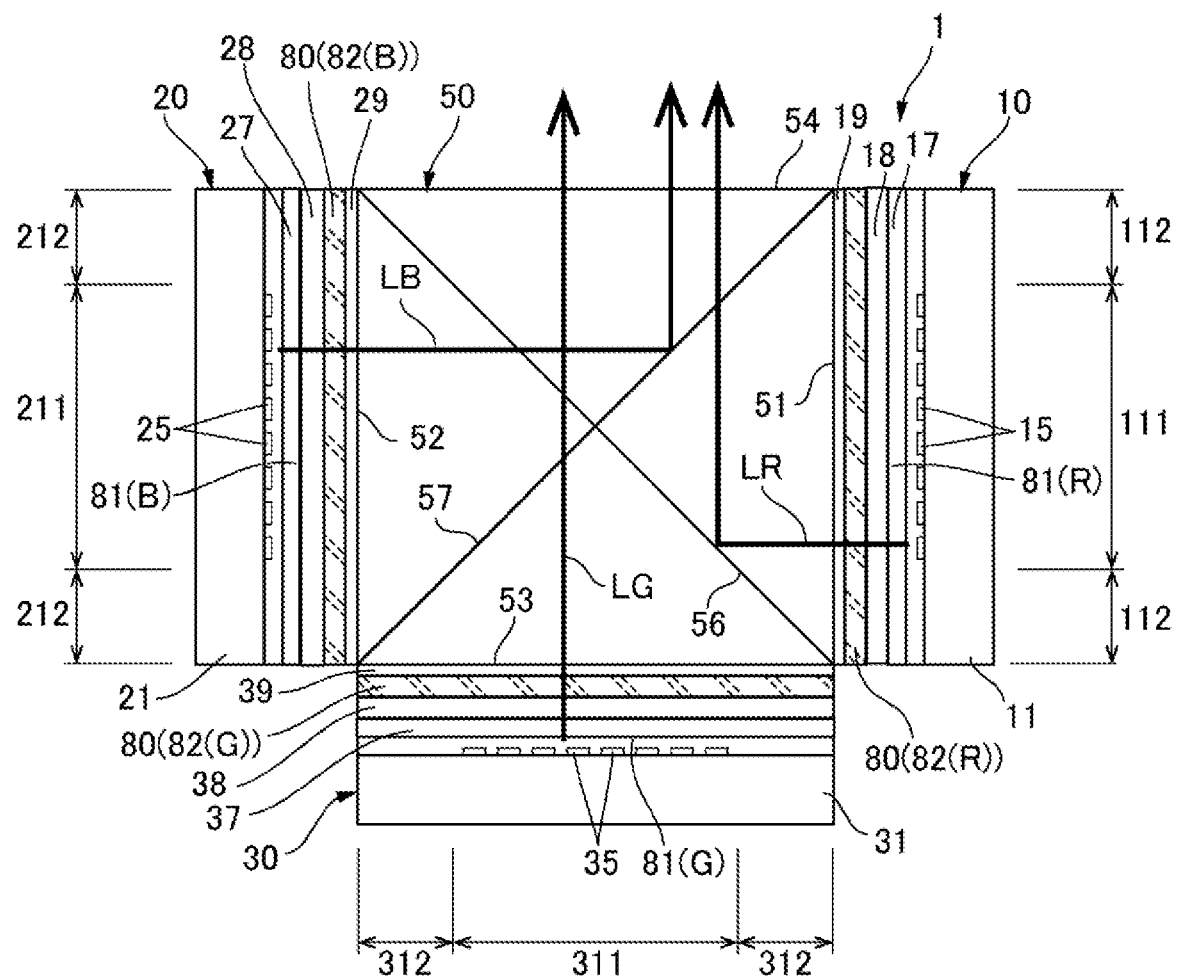
FIG. 15 is a plan view of the optical unit according to Third Exemplary Embodiment of the invention.

FIG. 15 is a plan view of the optical unit 1 according to Third Exemplary Embodiment of the invention. In Second Exemplary Embodiment, the coloring layer of First Exemplary Embodiment is used as the color filter, but in this exemplary embodiment, as illustrated in FIG. 15, the coloring layer is configured by the color filter of First Exemplary Embodiment. More specifically, in the first panel 10, the light emitted from the plurality of first light-emitting elements 15 is colored by the first color filter 82(R), and is incident on the dichroic prism 50 as the first image light LR of the first wavelength range. In the second panel 20, the light emitted from the plurality of second light-emitting elements 25 is colored by the second color filter 82(B), and is incident on the dichroic prism 50 as the second image light LB of the second wavelength range. In the third panel 30, the light emitted from the plurality of third light-emitting elements 35 is colored by the third color filter 82(G), and is incident on the dichroic prism 50 as the third image light LG of the third wavelength range.

Fourth Exemplary Embodiment

Figure 16:
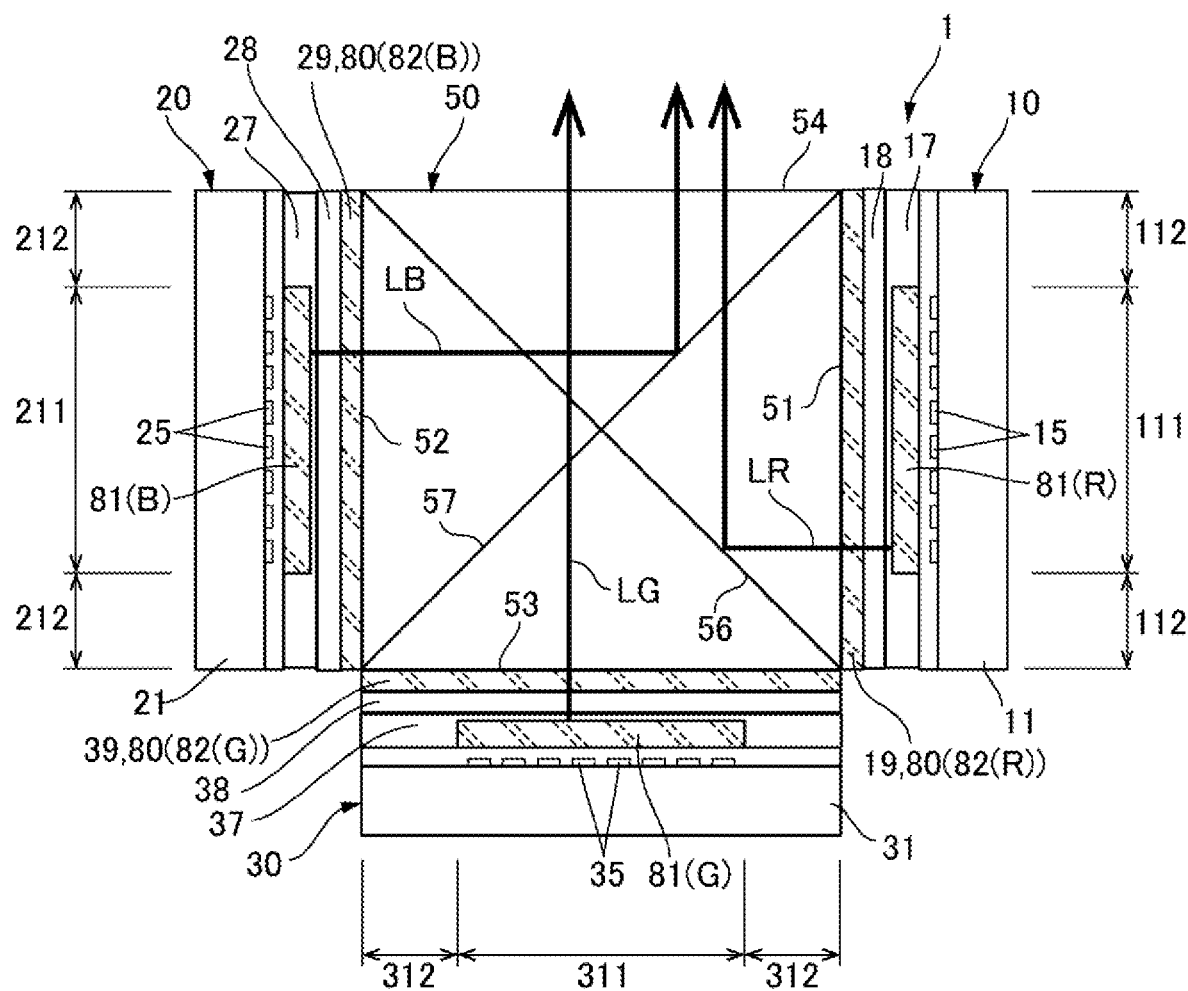
FIG. 16 is a plan view of the optical unit according to Fourth Exemplary Embodiment of the invention.

FIG. 16 is a plan view of the optical unit 1 according to Fourth Exemplary Embodiment of the invention. In this exemplary embodiment, a color filter is provided between each of the panels and the dichroic prism 50. More specifically, as illustrated in FIG. 16, the first color filter 82(R) is configured by the adhesive layer 19 that bonds the first panel 10 and the dichroic prism 50 together, the second color filter 82(B) is configured by the adhesive layer 29 that bonds the second panel 20 and the dichroic prism 50 together, and the third color filter 82(G) is configured by the adhesive layer 39 that bonds the third panel 30 and the dichroic prism 50 together.

Modified Example of Fourth Exemplary Embodiment

As a mode in which the color filter is provided between the panels and the dichroic prism 50, although not illustrated in the drawings, the color filters (the first color filter 82(R), the second color filter 82(B), and the third color filter 82(G)) may be laminated on the dichroic prism 50.

Figure 17:
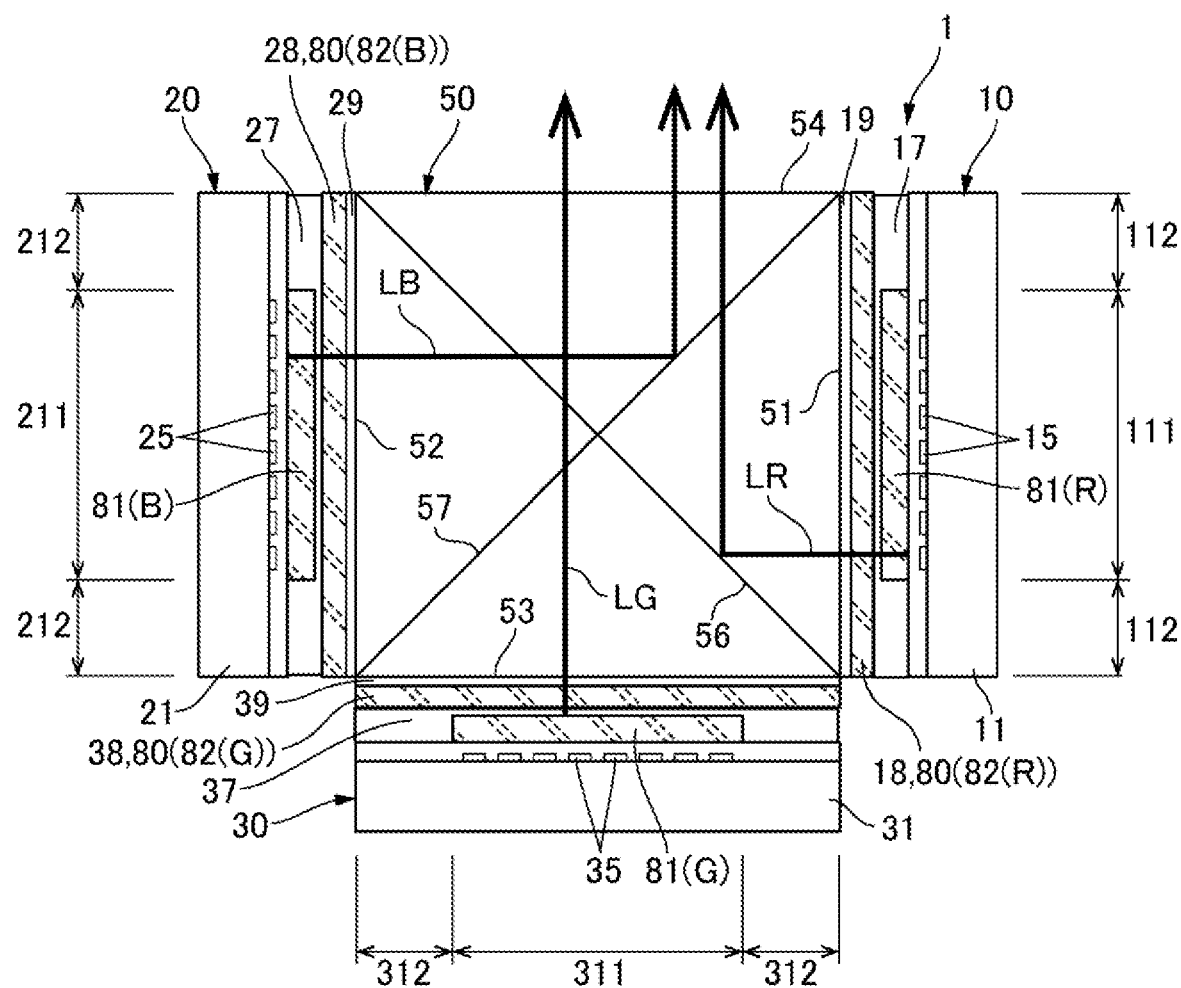
FIG. 17 is a plan view of the optical unit according to Fifth Exemplary Embodiment of the invention.

FIG. 17 is a plan view of the optical unit 1 according to Fifth Exemplary Embodiment of the invention. In this exemplary embodiment, the cover substrate 18 is adhered to a surface of the first panel 10 on the dichroic prism 50 side, by the adhesive layer 17, and the first color filter 82(R) is configured by the cover substrate 18. Similarly, the cover substrate 28 is adhered to a surface of the second panel 20 on the dichroic prism 50 side, by the adhesive layer 27, and the second color filter 82(B) is configured by the cover substrate 28. Similarly, the cover substrate 38 is adhered to a surface of the third panel 30 on the dichroic prism 50 side, by the adhesive layer 37, and the third color filter 82(G) is configured by the cover substrate 38.

Sixth Exemplary Embodiment

As illustrated in FIG. 8, FIG. 9, and FIG. 10, the first color filter 82(R), the second color filter 82(B), and the third color filter 82(G) may be configured by mixing color materials into the adhesive layers 17, 27, and 37.

Other Exemplary Embodiments

In all of the above-described exemplary embodiments, the color filter 80 is provided between the dichroic prism 50 and all of the first panel 10, the second panel 20, and the third panel 30, but the color filter 80 may be provided between the dichroic prism 50 and one or some of the first panel 10, the second panel 20, and the third panel 30. Further, in all of the above-described exemplary embodiments, the panel facing the first incident surface 51 is the first panel 10, the panel facing the second incident surface 52 is the second panel 20, and the panel facing the third incident surface 53 is the third panel 30, but correspondences between the incident surfaces and the panels, and correspondences between the panels and the wavelength ranges of the image light emitted from the panels are not limited to the combinations described in the above-described embodiments.

In all the above-described exemplary embodiments, the optical resonators 16, 26, and 36 are provided on the first panel 10, the second panel 20, and the third panel 30, respectively, but the invention may be applied to a case in which the optical resonators 16, 26, and 36 are not provided. In all the above-described exemplary embodiments, the cover substrates 18, 28, and 38 are provided on the first panel 10, the second panel 20, and the third panel 30, respectively, but the invention may be applied to a case in which the cover substrates are not provided.

In all the above-described embodiments, the light-emitting elements emit white light, but the first light-emitting elements 15 themselves provided on the first panel 10 may emit the first image light LR of the first wavelength range, the second light-emitting elements 25 themselves provided on the second panel 20 may emit the second image light LB of the second wavelength range, and the third light-emitting elements 35 themselves provided on the third panel 30 may emit the third image light LG of the third wavelength range.

In all of the above-described exemplary embodiments, a case is exemplified in which each of the plurality of pixels has an organic electroluminescent element as a light-emitting element, but the invention may be applied to a case in which each of the plurality of pixels has a light-emitting diode or the like as the light-emitting element.

Configuration Example 1 of Display Device

Figure 18:
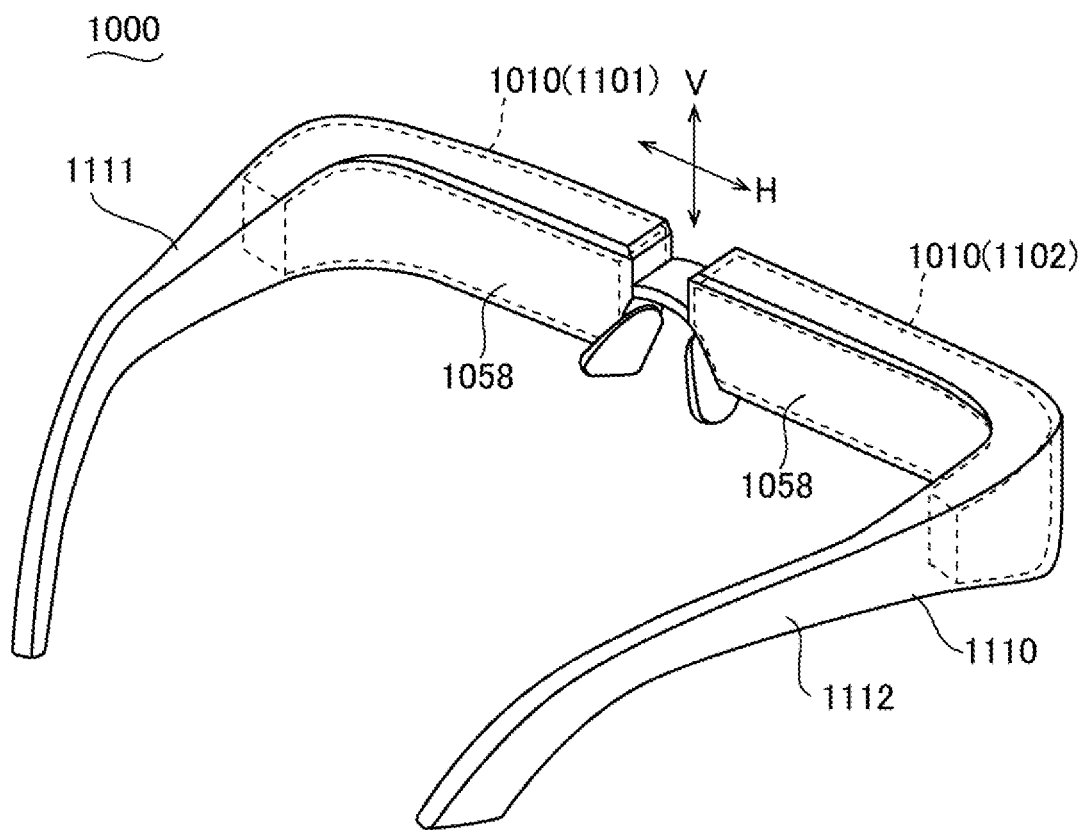
FIG. 18 is an explanatory diagram of a head-mounted display device.
Figure 19:
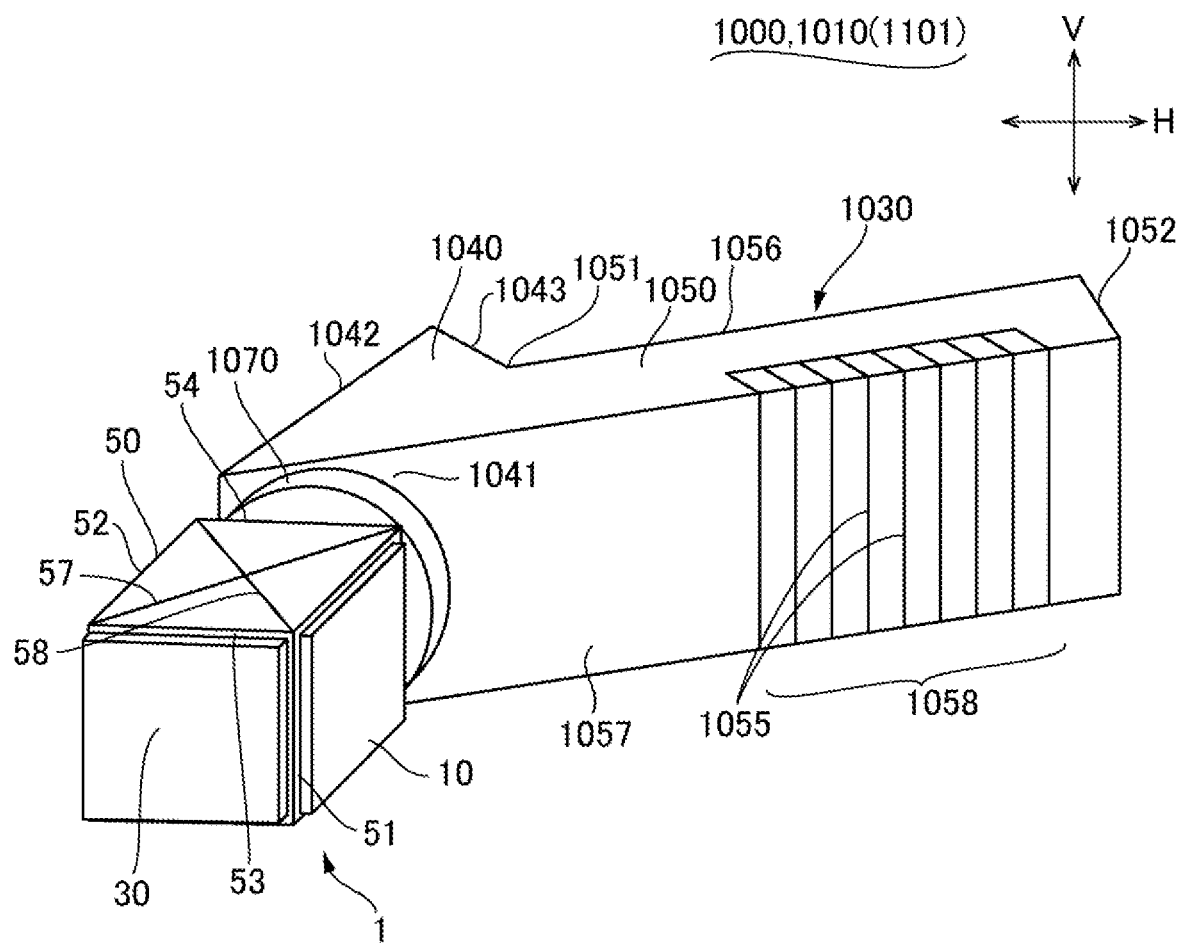
FIG. 19 is a perspective view schematically illustrating a configuration of an optical system of a display unit illustrated in FIG. 18.
Figure 20:
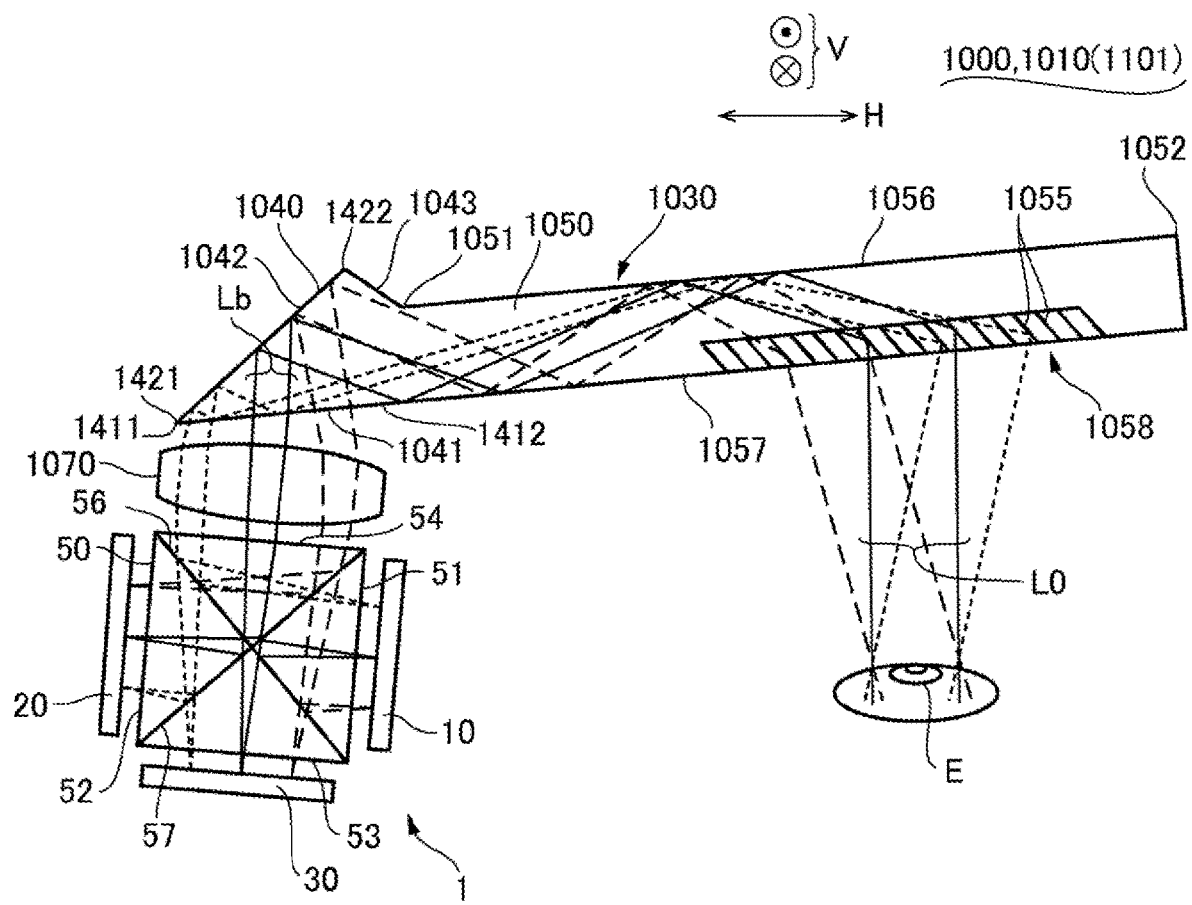
FIG. 20 is an explanatory diagram illustrating optical paths of the optical system illustrated in FIG. 19.

The optical unit 1 described in the above-described exemplary embodiments is used in a display device or the like described below. FIG. 18 is an explanatory diagram of a head-mounted display device 1000. FIG. 19 is a perspective view schematically illustrating a configuration of an optical system of virtual display units 1010 illustrated in FIG. 18. FIG. 20 is an explanatory diagram illustrating optical paths of the optical system illustrated in FIG. 19.

A display device 1000 illustrated in FIG. 18 is configured as a see-through eyeglass display, and includes a frame 1110 provided with left and right temples 1111 and 1112. In the display device 1000, the virtual display units 1010 are supported by the frame 1110, and an image emitted from the virtual display units 1010 is caused to be recognized as a virtual image by a user. In this exemplary embodiment, the display device 1000 is provided with a left-eye display unit 1101 and a right-eye display unit 1102 as the virtual display units 1010. The left-eye display unit 1101 and the right-eye display unit 1102 that have the same configuration are disposed left-right symmetrically.

Therefore, the left-eye display unit 1101 will be mainly described below, and the description of the right-eye display unit 1102 will be omitted. As illustrated in FIG. 19 and FIG. 20, in the display device 1000, the display unit 1101 includes the optical unit 1, and a light guide system 1030 that guides synthesized light Lb emitted from the optical unit 1 to an emission unit 1058. A projection lens system 1070 is disposed between the optical unit 1 and the light guide system 1030, and the synthesized light Lb emitted from the optical unit 1 enters the light guide system 1030 via the projection lens system 1070. The projection lens system 1070 is configured of a single collimate lens that has a positive power.

The light guide system 1030 is provided with a transmissive incident unit 1040 on which the synthesized light Lb is incident, and a transmissive light guide unit 1050, one end 1051 side of which is coupled to the incident unit 1040. In the embodiment, the incident unit 1040 and the light guide unit 1050 are configured as an integrated transmissive member.

The incident unit 1040 is provided with an incident surface 1041 on which the synthesized light Lb emitted from the optical unit 1 is incident, and a reflection surface 1042 that reflects the synthesized light Lb that has entered from the incident surface 1041 between the reflection surface 1042 and the incident surface 1041. The incident surface 1041 is a flat surface, an aspherical surface, a free form surface, or the like, and faces the optical unit 1 via the projection lens system 1070. The projection lens system 1070 is disposed obliquely such that an interval between the projection lens system 1070 and an end portion 1412 of the incident surface 1041 is larger than an interval between the projection lens system 1070 and an end portion 1411 of the incident surface 1041. A reflection film or the like is not formed on the incident surface 1041, but the incident surface 1041 fully reflects light that is incident at an incident angle equal to or greater than a critical angle. Thus, the incident surface 1041 has transmittance and reflectivity. The reflection surface 1042 is a surface facing the incident surface 1041 and is disposed obliquely such that an end portion 1422 of the reflection surface 1042 is separated farther from the incident surface 1041 than from an end portion 1421 of the incident surface 1041. Thus, the incident unit 1040 has a substantially triangular shape. The incident surface 1042 is a flat surface, an aspherical surface, a free form surface, or the like. The reflection surface 1042 can has a configuration in which a reflective metal layer, mainly formed of aluminum, silver, magnesium, chrome or the like, is formed.

The light guide unit 1050 is provided with a first surface 1056 (a first reflection surface) that extends from one end 1051 to another end 1052 side, a second surface 1057 (a second reflection surface) that faces and extends in parallel to the first surface 1056 from the one end 1051 side to the other end 1052 side, and an emission portion 1058 provided on a section of the second surface 1057 that is separated from the incident unit 1040. The first surface 1056 and the reflection surface 1042 of the incident unit 1040 are joined together by an inclined surface 1043. A thickness of the first surface 1056 and the second surface 1057 is thinner than the incident unit 1040. The first surface 1056 and the second surface 1057 reflect all the light that is incident at an incident angle equal to or greater than the critical angle, on the basis of a refractive index difference between the light guide unit 1050 and the outside (the air). Thus, a reflection film and the like is not formed on the first surface 1056 and the second surface 1057.

The emission unit 1058 is configured on a part of the light guide unit 1050 on the second surface 1057 side in the thickness direction of the light guide unit 1050. In the emission unit 1058, a plurality of partial reflection surfaces 1055 that are inclined obliquely with respect to a normal line with respect to the second surface 1057 are arranged so as to be mutually parallel to each other. The emission unit 1058 is a portion, which overlaps the plurality of partial reflection surfaces 1055, of the second surface 1057, and is a region having a predetermined width in an extending direction of the light guide unit 1050. Each of the plurality of partial reflection surfaces 1055 is formed of a dielectric multilayer film. Further, at least one of the plurality of partial reflection surfaces 1055 may be a composite layer of a dielectric multilayer film and a reflective metal layer (thin film) mainly formed of aluminum, silver, magnesium, chrome, or the like. When the partial reflection surface 1055 is configured to include a metal layer, an effect can be obtained to improve the reflectance of the partial reflection surface 1055, or an effect that the incident angle dependence or the polarization dependence of the transmittance and the reflectance of the partial reflection surface 1055 can be optimized. Note that the emission unit 1058 may have a mode in which an optical element, such as a diffraction grating, a hologram, or the like is provided.

In the display device 1000 configured in this manner, the synthesized light Lb formed of the parallel light incident from the incident unit 1040, is refracted by the incident surface 1041 and is oriented toward the reflection surface 1042. Next, the synthesized light Lb is reflected by the reflection surface 1042, and is oriented toward the incident surface 1041 again. At this time, since the synthesized light Lb is incident on the incident surface 1041 at the incident angle equal to or greater than the critical angle, the synthesized light Lb is reflected by the incident surface 1041 toward the light guide unit 1050, and is oriented toward the light guide unit 1050. Note that, in the incident unit 1040, the configuration is used in which the synthesized light Lb that is the parallel light is incident on the incident surface 1041, but a configuration may be adopted in which the incident surface 1041 and the reflection surface 1042 are configured to have a free form curve or the like, and after the synthesized light Lb, which is non-parallel light, is incident on the incident surface 1041, the synthesized light Lb is reflected between the reflection surface 1042 and the incident surface 1041 and is converted to the parallel light while being reflected.

In the light guide unit 1050, the synthesized light Lb is reflected between the first surface 1056 and the second surface 1057, and advances. Then, a part of the synthesized light Lb that is incident on the partial reflection surface 1055 is reflected by the partial reflection surface 1055 and is emitted from the emission unit 1058 toward an eye E of an observer. Further, the rest of the synthesized light Lb incident on the partial reflection surface 1055 passes through the partial reflection surface 1055 and is incident on the next, adjacent, partial reflection surface 1055. As a result, the synthesized light Lb that is reflected by each of the plurality of partial reflection surfaces 1055 is emitted from the emission unit 1058 toward the eye E of the observer. Therefore, the observer can recognize a virtual image. At this time, with regard to the light from the outside, the light that has entered the light guide unit 1050 from the outside passes through the partial reflection surfaces 1055 after entering the light guide unit 1050, and reaches the eye E of the observer. As a result, the observer can see the color image emitted from the optical unit 1 and can also see the outside background and the like in a see through manner.

Configuration Example 2 of Display Device

Figure 21:
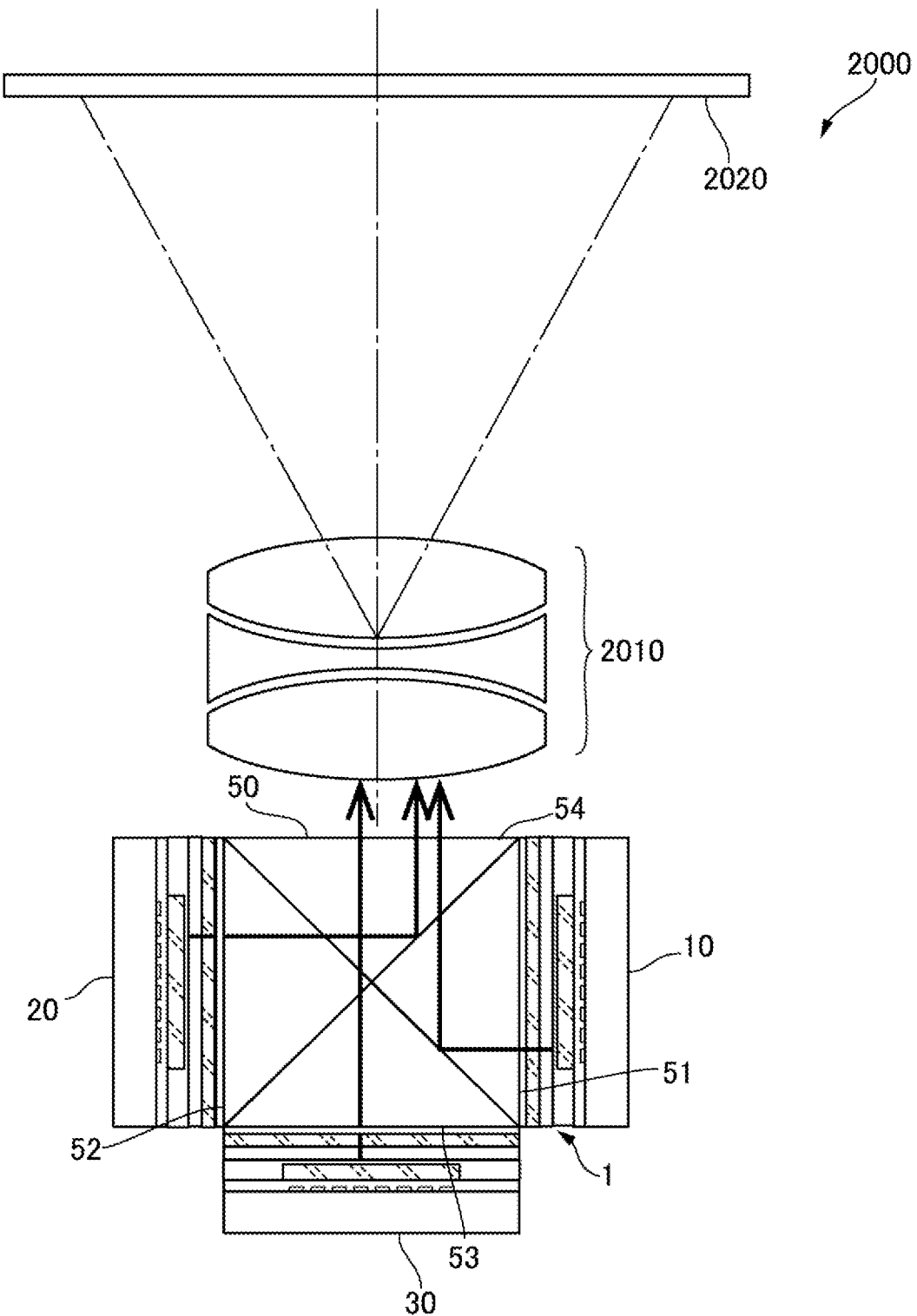
FIG. 21 is an explanatory diagram of a projection-type display device.

FIG. 21 is an explanatory diagram of a projection-type display device 2000. The display device 2000 illustrated in FIG. 21 includes the optical unit 1 according to the above-described exemplary embodiments, and a projection optical system 2100 that expands and projects the synthesized light Lb emitted from the optical unit 1 onto a projection receiving member 2200 and the like, such as a screen.

Other Configuration Examples of Display Device

The display device (electronic apparatus) provided with the optical unit 1 described in the above-described exemplary embodiments can be an electronic view finder (EVF) or the like used in an imaging device, such as a video camera and a still camera.

The entire disclosure of Japanese Patent Application No. 2018-059467, filed Mar. 27, 2018 is expressly incorporated by reference herein.

What is claimed is:
1. An optical unit comprising:
a dichroic prism which includes a first incident surface, a second incident surface facing the first incident surface, a third incident surface provided between the first incident surface and the second incident surface, an emission surface facing the third incident surface, a first dichroic mirror configured to reflect light incident from the first incident surface toward the emission surface and transmit light incident from the second incident surface and the third incident surface, and a second dichroic mirror configured to reflect light incident from the second incident surface toward the emission surface and transmit light incident from the first incident surface and the third incident surface;

a first panel which includes a first light-emitting element in a first display region, image light emitted from the first display region being incident, as first image light of a first wavelength range, on one of the incident surfaces, among the first incident surface, the second incident surface, and the third incident surface;

a second panel which includes a second light-emitting element in a second display region, image light emitted from the second display region being incident, as second image light of a second wavelength range, on another incident surface that is different to the one of the incident surfaces, among the first incident surface, the second incident surface, and the third incident surface;

a third panel which includes a third light-emitting element in a third display region, image light emitted from the third display region being incident, as third image light of a third wavelength range, on remaining one of the incident surfaces that is different to the one of the incident surfaces and the other of the incident surfaces, among the first incident surface, the second incident surface, and the third incident surface, wherein a first color filter that selectively transmits light of the first wavelength range is provided between the first light-emitting element and the dichroic prism.

2. The optical unit according to claim 1, wherein the first panel is provided with a first optical resonator having a resonance wavelength corresponding to the first wavelength range.

3. The optical unit according to claim 1, wherein the first color filter and the first panel are integrally provided.

4. The optical unit according to claim 3, wherein the first panel includes a cover substrate fixed on the dichroic prism side of the first light-emitting element, and the first color filter is provided on the cover substrate.

5. The optical unit according to claim 3, wherein the first panel includes a coloring layer that colors the light emitted from the first light-emitting element to be the light of the first wavelength range.

6. The optical unit according to claim 3, wherein the first color filter is provided as a coloring layer that colors the light emitted from the first light-emitting element to be the light of the wavelength range.

7. The optical unit according to claim 3, wherein the first panel includes a cover substrate fixed by an adhesive layer, on the dichroic prism side of the first light-emitting element, and the first color filter is configured by the adhesive layer.

8. The optical unit according to claim 3, wherein the first panel includes a cover substrate fixed on the dichroic prism side of the first light-emitting element, and the first color filter is configured by the cover substrate.

9. The optical unit according to claim 1, wherein the first color filter is provided between the first panel and the dichroic prism.

10. The optical unit according to claim 9, comprising: an adhesive layer that fixes the first panel to the dichroic prism, wherein the first color filter is configured by the adhesive layer.

11. The optical unit according to claim 9, wherein the first color filter is laminated over the dichroic prism.

12. The optical unit according to claim 1, wherein a second color filter that selectively transmits light of the second wavelength range is provided between the second light-emitting element and the dichroic prism.

13. The optical unit according to claim 12, wherein the second panel is provided with a second optical resonator having a resonance wavelength corresponding to the second wavelength range.

14. The optical unit according to claim 12, wherein a third color filter that selectively transmits light of the third wavelength range is provided between the third light-emitting element and the dichroic prism.

15. The optical unit according to claim 14, wherein the third panel is provided with a third optical resonator having a resonance wavelength corresponding to the third wavelength range.

16. The optical unit according to claim 1, wherein the first color filter is light absorbent.

17. The optical unit according to claim 1, wherein the first color filter is provided in a region through which, among luminous fluxes of image light emitted toward the dichroic prism from the first display region, an effective luminous flux corresponding to a luminous flux emitted from the emission surface passes.

18. The optical unit according to claim 1, wherein the first color filter is provided in a region through which, among luminous fluxes of image light emitted toward the dichroic prism from the first display region, an effective luminous flux used in display of an image passes.

19. A display device provided with the optical unit according to claim 1, wherein the display device is configured to display an image using synthesized light of the first image light, the second image light, and the third image light emitted from the emission surface of the dichroic prism.

20. The display device according to claim 19, comprising: a virtual display unit configured to display a virtual image using the synthesized light.

21. The display device according to claim 19, comprising: a projection optical system configured to project the synthesized light.

* * * * *